US012720943B2

(12) United States Patent
Li

(10) Patent No.: US 12,720,943 B2
(45) Date of Patent: Aug. 25, 2026

(54) QUANTUM DOT LIGHT-EMITTING DEVICE AND MANUFACTURING METHOD RELATED TO CROSSLINKING REACTION THEREFOR, A DISPLAY APPARATUS

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 521 days.

(21) Appl. No.: 18/270,849

(22) PCT Filed: Feb. 23, 2021

(86) PCT No.: PCT/CN2021/077442
§ 371 (c)(1),
(2) Date: Jul. 4, 2023

(87) PCT Pub. No.: WO2022/178663
PCT Pub. Date: Sep. 1, 2022

(65) Prior Publication Data
US 2024/0306412 A1 Sep. 12, 2024

(51) Int. Cl.
*H10K 50/115* (2023.01)
*H10K 50/16* (2023.01)
*H10K 71/40* (2023.01)

(52) U.S. Cl.
CPC ........... *H10K 50/115* (2023.02); *H10K 50/16* (2023.02); *H10K 71/40* (2023.02); *H10K 71/421* (2023.02)

(58) Field of Classification Search
CPC ...... H10K 50/115; H10K 50/16; H10K 71/40; H10K 71/421; H10K 71/00; C09K 11/06;
(Continued)

(56) References Cited

U.S. PATENT DOCUMENTS 6,310,189 B1 * 10/2001 Fodor .................. C07C 229/14 536/25.31
6,506,558 B1 * 1/2003 Fodor ................ G11C 13/0019 506/16

(Continued)

FOREIGN PATENT DOCUMENTS

CN 109659450 A 4/2019
CN 111471192 A 7/2020

(Continued)

OTHER PUBLICATIONS

PCT/CN2021/077442 international search report.

*Primary Examiner* — Caleb E Henry
(74) *Attorney, Agent, or Firm* — IPro, PLLC

(57) ABSTRACT

Disclosed are a quantum dot light-emitting device and a manufacturing method therefor, and a display apparatus, including: coating a substrate with a quantum dot solution, wherein each quantum dot includes a quantum dot body and a first crosslinkable ligand connected to the surface of the quantum dot body, and when the quantum dots are in a solution state, the first crosslinkable ligand is in a decrosslinking state; carrying out cross-linking reaction on the first crosslinkable ligand of the quantum dots at a first temperature; using laser to irradiate a quantum dot region to be removed after the crosslinking reaction, the quantum dots in said region being decrosslinked at a second temperature generated by laser irradiation, and a difference between the second temperature and the first temperature being greater
(Continued)

than a preset value; and removing the quantum dots in said region to form a patterned quantum dot layer.

19 Claims, 18 Drawing Sheets

(58) Field of Classification Search
CPC ... C09K 11/025; C09K 11/02; C09K 2211/18; H01L 51/502; H01L 51/56; H01L 51/0007; B82Y 20/00; B82Y 40/00; B82Y 30/00
See application file for complete search history.

(56) References Cited

U.S. PATENT DOCUMENTS

| | | | | |
|---|---|---|---|---|
| 7,294,449 | B1 * | 11/2007 | Gudeman | G03F 7/0047 430/270.1 |
| 8,343,627 | B2 * | 1/2013 | Zhong | G01N 33/54326 428/403 |
| 9,812,004 | B1 * | 11/2017 | Boshernitzan | G08C 17/02 |
| 9,831,706 | B2 * | 11/2017 | MacWilliams | H02J 7/32 |
| 9,874,693 | B2 * | 1/2018 | Baiocco | G02B 6/12004 |
| 9,943,840 | B2 * | 4/2018 | Shaffer | C09C 1/043 |
| 11,056,650 | B2 * | 7/2021 | Kang | H10K 50/11 |
| 2007/0134699 | A1 * | 6/2007 | Glover | B01J 19/0046 977/924 |
| 2010/0068522 | A1 * | 3/2010 | Pickett | B82Y 30/00 977/773 |
| 2010/0113813 | A1 * | 5/2010 | Pickett | C09C 3/08 977/774 |
| 2010/0213438 | A1 * | 8/2010 | Cho | H10K 50/156 438/47 |
| 2011/0006269 | A1 * | 1/2011 | Petruska | C01G 15/00 977/773 |
| 2011/0037029 | A1 * | 2/2011 | Liu | C08G 65/3322 252/500 |
| 2011/0294995 | A1 * | 12/2011 | Huo | C08L 33/02 977/773 |
| 2012/0270231 | A1 * | 10/2012 | Smith | C09K 11/584 435/7.1 |
| 2012/0280345 | A1 * | 11/2012 | Zhu | G02B 6/1226 257/E31.127 |
| 2013/0004522 | A1 * | 1/2013 | Dvir | A61K 9/5138 424/178.1 |
| 2013/0146854 | A1 * | 6/2013 | Dong | H10K 50/11 438/45 |
| 2013/0345458 | A1 * | 12/2013 | Freeman | C09K 11/883 556/439 |
| 2014/0027816 | A1 * | 1/2014 | Cea | H10D 62/822 257/E29.085 |
| 2014/0197507 | A1 * | 7/2014 | Assefa | H10F 39/807 438/69 |
| 2015/0031217 | A1 * | 1/2015 | Naasani | C09K 11/883 438/780 |
| 2015/0091093 | A1 * | 4/2015 | Bouche | H10D 64/251 257/369 |
| 2015/0267106 | A1 * | 9/2015 | Pillay Narrainen | C09K 11/02 252/301.36 |
| 2015/0268417 | A1 * | 9/2015 | Assefa | G02B 6/4257 385/14 |
| 2018/0062101 | A1 * | 3/2018 | Li | H10K 50/115 |
| 2018/0108842 | A1 * | 4/2018 | Li | H10K 59/35 |
| 2018/0298154 | A1 * | 10/2018 | Lundorf | C04B 35/48 |
| 2019/0207136 | A1 * | 7/2019 | Chen | H10K 85/361 |
| 2019/0302615 | A1 * | 10/2019 | Krysak | G03F 7/0043 |
| 2020/0131435 | A1 * | 4/2020 | Pousthomis | C09D 11/50 |
| 2020/0259110 | A1 * | 8/2020 | Angioni | H10K 50/15 |
| 2020/0373279 | A1 * | 11/2020 | Ganapathiappan | G03F 7/028 |
| 2021/0179939 | A1 * | 6/2021 | Stokes | C09K 11/565 |
| 2021/0226144 | A1 | 7/2021 | Li | |
| 2021/0234076 | A1 * | 7/2021 | Kwok | H10H 20/8511 |
| 2022/0140271 | A1 * | 5/2022 | Li | H10K 71/191 257/13 |
| 2022/0145174 | A1 * | 5/2022 | Lee | C08K 9/06 |

FOREIGN PATENT DOCUMENTS

| | | | |
|---|---|---|---|
| CN | 112018270 | A | 12/2020 |
| CN | 112239664 | A | 1/2021 |
| CN | 112310330 | A | 2/2021 |

* cited by examiner

Carrier film layer (electron transport layer) 3

First electrode (cathode) 2

Base substrate 1

QUANTUM DOT LIGHT-EMITTING DEVICE AND MANUFACTURING METHOD RELATED TO CROSSLINKING REACTION THEREFOR, A DISPLAY APPARATUS

CROSS REFERENCE TO RELATED APPLICATION

The present disclosure is a National Stage of International Application No. PCT/CN2021/077442, filed on Feb. 23, 2021, of which is incorporated in its entirety herein by reference.

TECHNICAL FIELD

The present disclosure relates to the technical field of display, in particular to a quantum dot light-emitting device and a manufacturing method therefor, and a display apparatus.

BACKGROUND

With deep development of a quantum dot preparation technology, the stability and luminous efficiency of quantum dots are constantly increased, the research of quantum dot light emitting diodes (QLEDs) is constantly intense, and the application prospect of the QLEDs in the display field is increasingly bright. However, at present, the production efficiency of the QLEDs has not yet reached a level of mass production, and the most important reason is that high-resolution patterning techniques for the QLEDs have not yet achieved a breakthrough at present. The inorganic nanoparticle characteristics of quantum dots make it impossible to form films and pattern the quantum dots by evaporation.

SUMMARY

An embodiment of the present disclosure provides a manufacturing method for a quantum dot light-emitting device, including: coating a substrate with a quantum dot solution; wherein each quantum dot includes a quantum dot body and a first crosslinkable ligand connected to the surface of the quantum dot body; and when the quantum dots are in a solution state, the first crosslinkable ligands are in a decrosslinking state; carrying out a crosslinking reaction on the first crosslinkable ligands of the quantum dots at a first temperature; using laser to irradiate a quantum dot region to be removed after the crosslinking reaction, the quantum dots in the region to be removed being decrosslinked at a second temperature generated by laser irradiation; and a difference between the second temperature and the first temperature being greater than a preset value; and removing the quantum dots in the region to be removed to form a patterned quantum dot layer.

Optionally, in the above manufacturing method provided by the embodiment of the present disclosure, before coating the substrate with the quantum dot solution, the method further includes: forming the substrate; the forming the substrate specifically includes: sequentially forming a first electrode and a carrier film layer on a base substrate; wherein the surface of the carrier film layer is free of a crosslinkable ligand; and the carrying out the crosslinking reaction on the first crosslinkable ligand of the quantum dots at the first temperature specifically includes: carrying out a crosslinking reaction between first crosslinkable ligands corresponding to adjacent quantum dots.

Optionally, in the above manufacturing method provided by the embodiment of the present disclosure, each first crosslinkable ligand includes: coordination groups which are subjected to coordination binding with the corresponding quantum dot body, first connecting groups connected with the coordination groups, and first crosslinkable groups connected with the first connecting groups; and a crosslinking reaction occurs between the first crosslinkable groups.

Optionally, in the above manufacturing method provided by the embodiment of the present disclosure, each first crosslinkable group includes at least one of: cyclopentadiene, a cyclopentadiene derivative, dicyclopentadiene, a dicyclopentadiene derivative or bisphenol p-aminolactone; or, the first crosslinkable group corresponding to at least one of the quantum dots includes a first group and a second group; wherein the first group is maleimide and the second group is furan; or, the first group is maleic anhydride or a derivative thereof, and the second group is polyol; or, the first group is maleimide and the second group is furfuryl ester.

Optionally, in the above manufacturing method provided by the embodiment of the present disclosure, a mole number of the first group corresponding to at least one of the quantum dots is identical to a mole number of the second group corresponding to at least one of the quantum dots.

Optionally, in the above manufacturing method provided by the embodiment of the present disclosure, before coating the substrate with the quantum dot solution, the method further includes: forming the substrate; the forming the substrate specifically includes: sequentially forming a first electrode and a carrier film layer on a base substrate; wherein second crosslinkable ligands are connected to the surface of the carrier film layer; and the carrying out the crosslinking reaction on the first crosslinkable ligand of the quantum dots at the first temperature specifically includes: carrying out a crosslinking reaction between the first crosslinkable ligands of the quantum dots and the second crosslinkable ligands; or, while carrying out the crosslinking reaction between the first crosslinkable ligands of the quantum dots and the second crosslinkable ligands, carrying out a crosslinking reaction between first crosslinkable ligands corresponding to adjacent quantum dots at the first temperature.

Optionally, in the above manufacturing method provided by the embodiment of the present disclosure, each first crosslinkable ligand includes: coordination groups which are subjected to coordination binding with the corresponding quantum dot body, first connecting groups connected with the coordination groups, and first crosslinkable groups connected with the first connecting groups; and each second crosslinkable ligand includes: second connecting groups connected to the surface of the carrier film layer, and second crosslinkable groups connected to the second connecting groups.

Optionally, in the above manufacturing method provided by the embodiment of the present disclosure, both the first crosslinkable groups and the second crosslinkable groups are cyclopentadiene or a derivative thereof; or, both the first crosslinkable groups and the second crosslinkable groups are dicyclopentadiene or a derivative thereof; or, both the first crosslinkable groups and the second crosslinkable groups are bisphenol p-aminolactone; or, one of the first crosslinkable group and the second crosslinkable group is maleimide, and the other is furan; or, one of the first crosslinkable group and the second crosslinkable group is maleic anhydride or a derivative thereof, and the other is polyol; or, one of the first crosslinkable group and the second crosslinkable group is maleimide, and the other is furfuryl ester.

Optionally, in the above manufacturing method provided by the embodiment of the present disclosure, the carrier film layer is an electron transport layer, and a structure of each second connecting group is

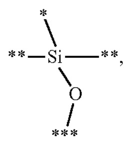

wherein * is a position connecting with the corresponding second crosslinkable group,  is a position connecting with other groups, and * is a position connecting with the electron transport layer.

Optionally, in the above manufacturing method according to the embodiment of the present disclosure, each coordination group includes at least one of $-NH_2$, $-SH$, $-COOH$, $-P$ or $-PO_2$, and each first connecting group is $-(CH_2)_n-$, wherein n=2~6.

Optionally, in the above manufacturing method provided by the embodiment of the present disclosure, removing the quantum dots in the region to be removed specifically includes: washing the quantum dots after being irradiated with the laser with a solvent, wherein the quantum dots in the region to be removed are dissolved in the solvent, and the quantum dots subjected to a crosslinking reaction are not dissolved in the solvent.

Optionally, in the above manufacturing method provided by the embodiment of the present disclosure, a wavelength of the laser irradiation is 800-1650 nm, and a power density of the laser irradiation is 1-10 $W/cm^2$.

Optionally, in the above manufacturing method provided by the embodiment of the present disclosure, coating the substrate with the quantum dot solution, when the quantum dots are in the solution state, the first crosslinkable ligands being in the decrosslinking state, specifically includes: coating the heated substrate with the quantum dot solution after the substrate is heated to the second temperature.

Correspondingly, an embodiment of the present disclosure further provides a quantum dot light-emitting device, including a substrate and a patterned quantum dot layer located on the substrate, wherein each quantum dot of the quantum dot layer includes a quantum dot body and a first crosslinkable ligand connected to the surface of the quantum dot body; and the quantum dot layer is of a structure obtained after the first crosslinkable ligands are subjected to a crosslinking reaction at a first temperature.

Optionally, in the above quantum dot light-emitting device provided by the embodiment of the present disclosure, each first crosslinkable ligand includes: coordination groups which are subjected to coordination binding with the corresponding quantum dot body, first connecting groups connected with the coordination groups, and first crosslinkable groups connected with the first connecting groups; and the quantum dot layer is of a structure obtained after a crosslinking reaction occurs between first crosslinkable groups corresponding to adjacent quantum dots.

Optionally, in the above quantum dot light-emitting device provided by the embodiment of the present disclosure, each first crosslinkable group includes at least one of: cyclopentadiene, a cyclopentadiene derivative, dicyclopentadiene, a dicyclopentadiene derivative or bisphenol p-aminolactone; or, the first crosslinkable group corresponding to at least one of the quantum dots includes a first group and a second group; wherein the first group is maleimide and the second group is furan; or, the first group is maleic anhydride or a derivative thereof, and the second group is polyol; or, the first group is maleimide and the second group is furfuryl ester.

Optionally, in the above quantum dot light-emitting device provided by the embodiment of the present disclosure, a mole number of the first group corresponding to at least one of the quantum dots is identical to a mole number of the second group corresponding to at least one of the quantum dots.

Optionally, in the above quantum dot light-emitting device provided by the embodiment of the present disclosure, the substrate includes: a base substrate, a first electrode located on the base substrate, and a carrier film layer located on the first electrode; wherein the quantum dot layer is located on the carrier film layer, and second crosslinkable ligands are connected to the surface of the carrier film layer; and the quantum dot layer is of a structure obtained after the first crosslinkable ligands and the second crosslinkable ligands are subjected to a crosslinking reaction; or, the quantum dot layer is of a structure obtained after a crosslinking reaction occurs between the first crosslinkable ligands and the second crosslinkable ligands, and a crosslinking reaction occurs between first crosslinkable ligands corresponding to adjacent quantum dots.

Optionally, in the above quantum dot light-emitting device provided by the embodiment of the present disclosure, each first crosslinkable ligand includes: coordination groups which are subjected to coordination binding with the corresponding quantum dot body, first connecting groups connected with the coordination groups, and first crosslinkable groups connected with the first connecting groups; and each second crosslinkable ligand includes: second connecting groups connected to the surface of the carrier film layer, and second crosslinkable groups connected to the second connecting groups.

Optionally, in the above quantum dot light-emitting device provided by the embodiment of the present disclosure, both the first crosslinkable groups and the second crosslinkable groups are cyclopentadiene or a derivative thereof; or, both the first crosslinkable groups and the second crosslinkable groups are dicyclopentadiene or a derivative thereof; or, both the first crosslinkable groups and the second crosslinkable groups are bisphenol p-aminolactone; or, one of the first crosslinkable group and the second crosslinkable group is maleimide, and the other is furan; or, one of the first crosslinkable group and the second crosslinkable group is maleic anhydride or a derivative thereof, and the other is polyol; or, one of the first crosslinkable group and the second crosslinkable group is maleimide, and the other is furfuryl ester.

Optionally, in the above quantum dot light-emitting device provided by the embodiment of the present disclosure, the carrier film layer is an electron transport layer, and a structure of each second connecting group is

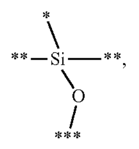

wherein * is a position connecting with the corresponding second crosslinkable group,  is a position connecting with other groups, and * is a position connecting with the electron transport layer.

Optionally, in the above quantum dot light-emitting device provided by the embodiment of the present disclosure, each coordination group includes at least one of $—NH_2$, —SH, —COOH, —P or $—PO_2$, and each first connecting group is $—(CH_2)_n—$, wherein n=2-6.

Correspondingly, an embodiment of the present disclosure further provides a display apparatus, including the above quantum dot light-emitting device.

DETAILED DESCRIPTION

Figure 1:
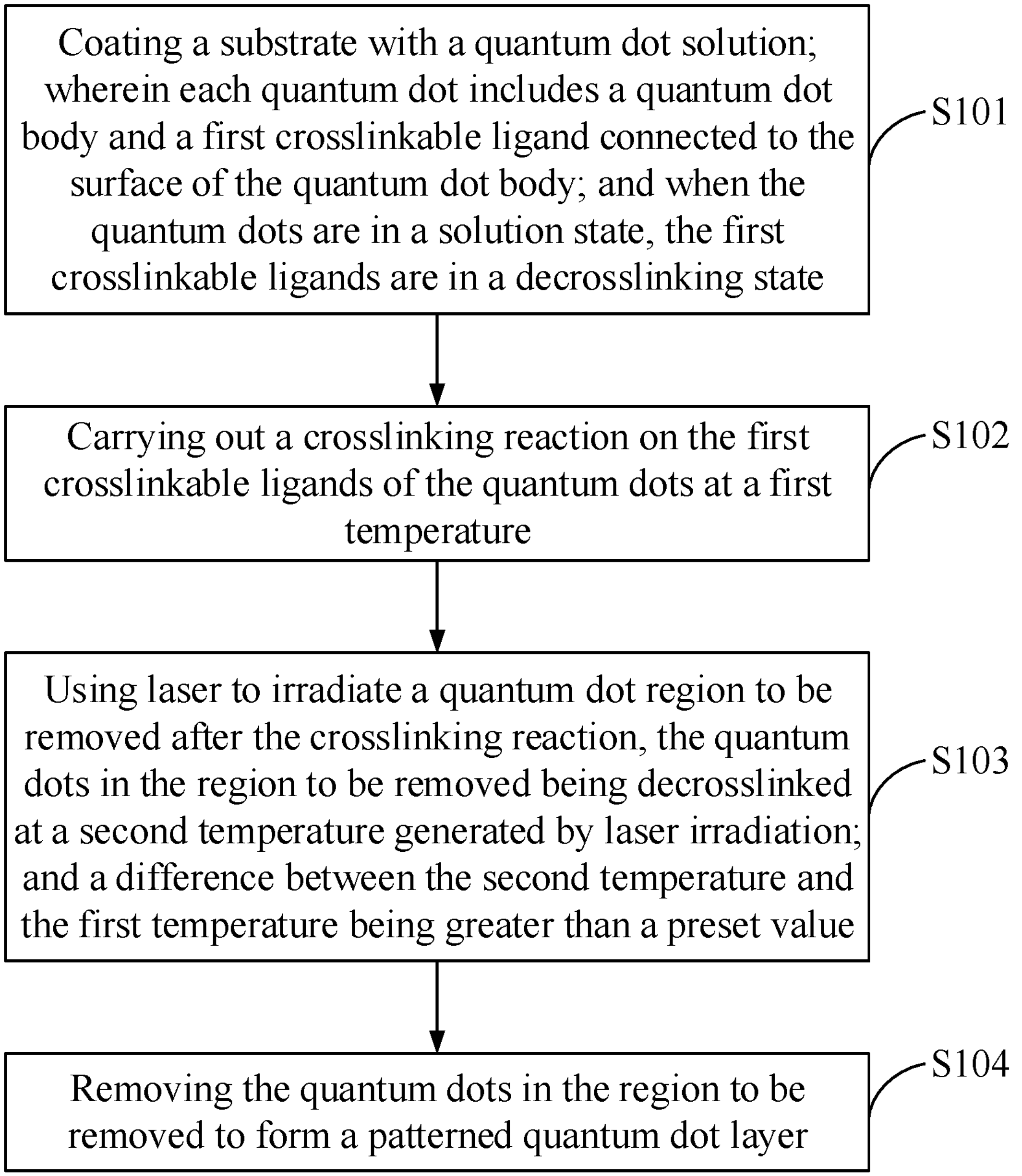
FIG. 1 is a flowchart of a manufacturing method for a quantum dot light-emitting device provided by an embodiment of the present disclosure.

In order to make objectives, technical solutions and advantages of the embodiments of the present disclosure clearer, the technical solutions of the embodiments of the present disclosure are described clearly and completely below with reference to the drawings of the embodiments of the present disclosure. Apparently, the described embodiments are some, not all, of the embodiments of the present disclosure. The embodiments in the present disclosure and the features in the embodiments may be combined with each other without conflict. Based on the described embodiments of the present disclosure, all other embodiments obtained by those of ordinary skill in the art without inventive efforts fall within the protection scope of the present disclosure.

Unless otherwise defined, the technical or scientific terms used in the present disclosure shall have the ordinary meaning as understood by those of ordinary skill in the art to which the present disclosure belongs. Similar words such as "including" or "comprising" used in the present disclosure mean that an element or item preceding the word covers elements or items listed behind the word and their equivalents without excluding other elements or items. "Connection" or "connected" and other similar words may include electrical connection, whether direct or indirect, instead of being limited to physical or mechanical connection. "Inner", "outer", "upper", "lower" and the like are only used to indicate a relative positional relationship, and the relative positional relationship may change accordingly when an absolute position of the described object changes.

It should be noted that sizes and shapes of all figures in the drawings do not reflect a true scale and are only intended to illustrate the contents of the present disclosure. Same or similar reference signs denote same or similar elements or elements with the same or similar function throughout.

In the related art, patterned quantum dots are generally manufactured by inkjet printing, but it is difficult to achieve high resolution by this method.

An embodiment of the present disclosure provides a manufacturing method for a quantum dot light-emitting device, as shown in FIG. 1, including:

S101, coating a substrate with a quantum dot solution; wherein each quantum dot includes a quantum dot body and a first crosslinkable ligand connected to the surface of the quantum dot body; and when the quantum dots are in a solution state, the first crosslinkable ligands are in a decrosslinking state;

S102, carrying out a crosslinking reaction on the first crosslinkable ligands of the quantum dots at a first temperature;

S103, using laser to irradiate a quantum dot region to be removed after the crosslinking reaction, the quantum dots in the region to be removed being decrosslinked at a second temperature generated by laser irradiation; and a difference between the second temperature and the first temperature being greater than a preset value; and

S104, removing the quantum dots in the region to be removed to form a patterned quantum dot layer.

In particular, for quantum dots, their solubility in a solvent is determined by ligands on their surfaces. For example, the original quantum dots may be dissolved in a solvent, such as octane and other nonpolar solvents, but after the ligands are subjected to a crosslinking reaction to form a quantum dot crosslinking system, the solubility of the quantum dots in the original solvent decreases. In this way, quantum dots that do not form a crosslinking system can still be dissolved in octane and thus be washed away; and the quantum dots that have formed the crosslinking system are no longer dissolved in octane and thus remain in specific positions.

According to the manufacturing method for the quantum dot light-emitting device provided by some embodiments of the present disclosure, the substrate is coated with the quantum dot solution in which the first crosslinkable ligands are in the decrosslinking state, the first crosslinkable ligands of the quantum dots are subjected to the crosslinking reaction at the first temperature, and the quantum dots which are subjected to the crosslinking reaction have a network structure, are more stable, are difficult to dissolve in a solvent, and remain on the substrate; the quantum dot region to be removed after the crosslinking reaction is then irradiated with the laser, the quantum dots in the region to be removed are decrosslinked at the second temperature generated by laser irradiation, the decrosslinked quantum dots can be dissolved in a solvent, and thus the quantum dots after being irradiated by the laser can be washed with the solvent to remove the quantum dots in the region to be removed to form the patterned quantum dot layer, that is, patterning of a quantum dot layer is completed; and compared with the related art, the method of the present disclosure can complete the patterning of the quantum dot layer without using an inkjet printing method or a photolithography method, and can form quantum dots with high resolution and good performance.

In some embodiments, the difference between the second temperature and the first temperature is greater than a preset value, for example, the preset value is 120° C. In one exemplary embodiment, the first temperature is normal temperature (e.g., 25° C.), the second temperature is 170° C., and the difference between the second temperature and the first temperature is 155° C., which is greater than the preset value. The preset value may also be set to be 130° C., 140° C., or the like according to process requirements. The first crosslinkable ligands of the quantum dots are easily subjected to a crosslinking reaction to form a dimer at a normal temperature, while the crosslinked quantum dots are easily subjected to depolymerization to be decrosslinked during laser irradiation (i.e., a heating state), such as at a temperature of 170° C. Namely, the ligands of the quantum dots provided by the embodiment of the present disclosure adopt first crosslinkable ligands containing a thermoreversible crosslinking system.

Figure 2A:
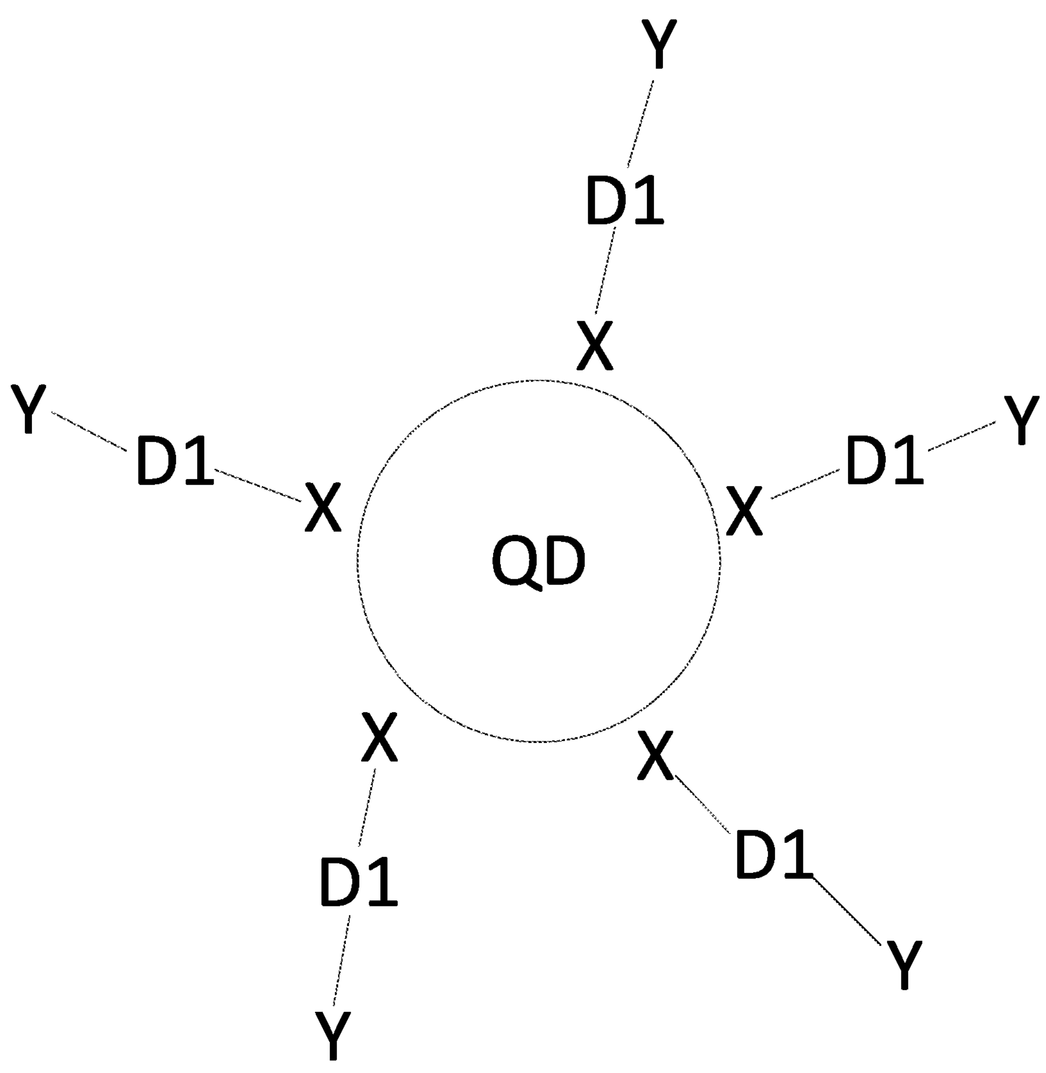
FIG. 2A is a schematic structural diagram of a quantum dot according to an embodiment of the present disclosure.

In some embodiments, as shown in FIG. 2A, each quantum dot includes a quantum dot body QD, and a first crosslinkable ligand connected to the surface of the quantum dot body QD, wherein each first crosslinkable ligand includes: coordination groups X which are subjected to coordination binding with the corresponding quantum dot body QD, first connecting groups D1 connected with the coordination groups X, and first crosslinkable groups Y connected with the first connecting groups D1; and a crosslinking reaction can occur between the first crosslinkable groups at the first temperature.

Figure 2B:
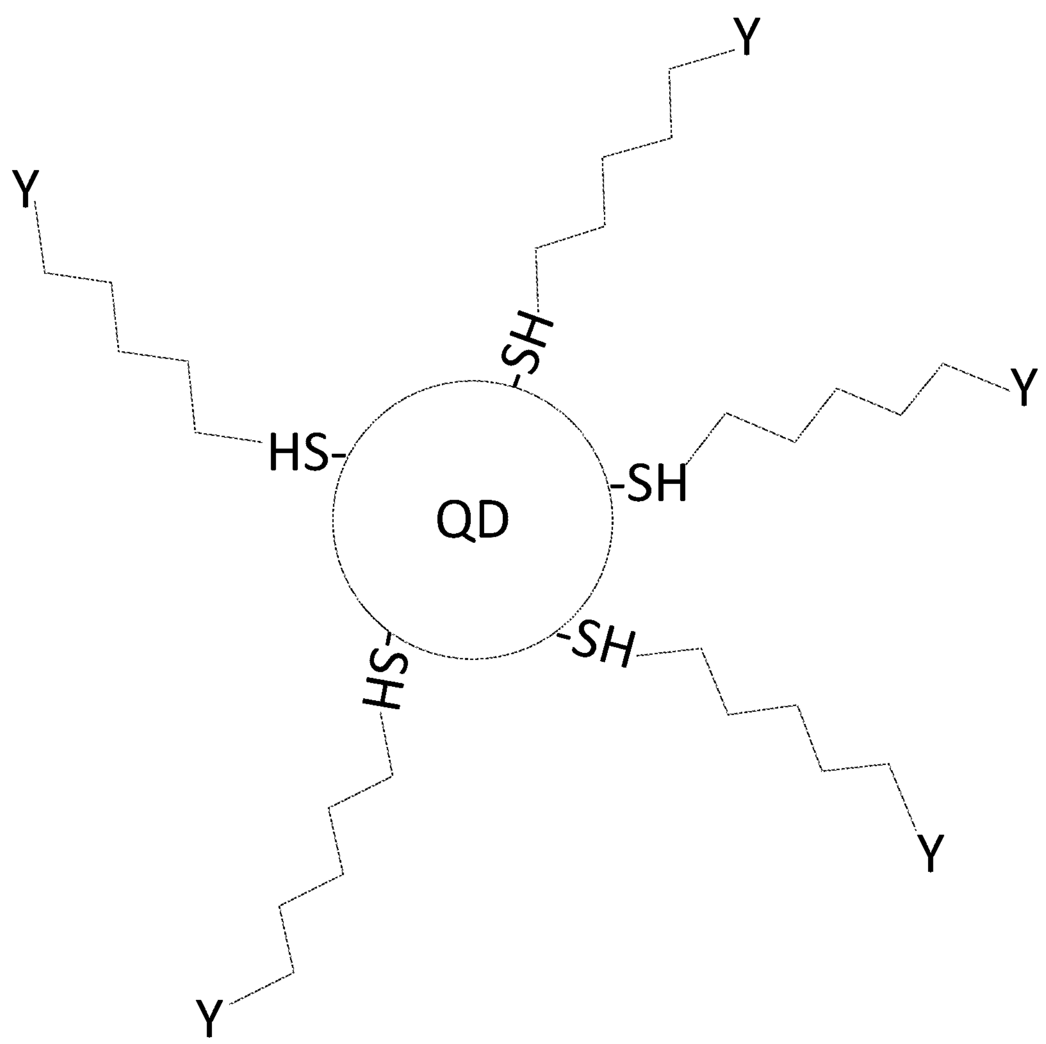
FIG. 2B is a specific schematic structural diagram of a quantum dot corresponding to FIG. 2A.

In specific implementation, in the above manufacturing method provided by some embodiments of the present disclosure, as shown in FIG. 2A, each coordination group X includes, but is not limited to, at least one of $—NH_2$, —SH, —COOH, —P or $—PO_2$, and each first connecting group D1 may be, but is not limited to, $—(CH_2)_n—$, wherein n=2~6. Taking the condition that each coordination group X is —SH and each first connecting group D1 is $—(CH_2)_5—$ as an example, a quantum dot structure is shown in FIG. 2B.

In specific implementation, in the above manufacturing method provided by some embodiments of the present disclosure, a wavelength of the laser irradiation may be 800-1650 nm, and a power density of the laser irradiation may be 1-10 $W/cm^2$.

Some embodiments of the present disclosure adopt infrared laser to irradiate quantum dots, which can generate a local high temperature in a specific region, so that a high temperature is generated at a position where a quantum dot pattern is required to perform decrosslinking, the desired patterned quantum dots can be formed, the manufacturing method is simple, and high-resolution quantum dots can be formed.

Optionally, the quantum dots provided by embodiments of the present disclosure include, but are not limited to, quantum dots such as CdS, CdSe, ZnSe, InP, PbS, $CsPbCl_3$, $CsPbBr_3$, $CsPbI_3$, CdS/ZnS, CdSe/ZnSe, CdSe/ZnS, ZnSe, InP/ZnS, PbS/ZnS, $CsPbCl_3$/ZnS, $CsPbBr_3$/ZnS, $CsPhI_3$/ZnS and the like.

Figure 3A:
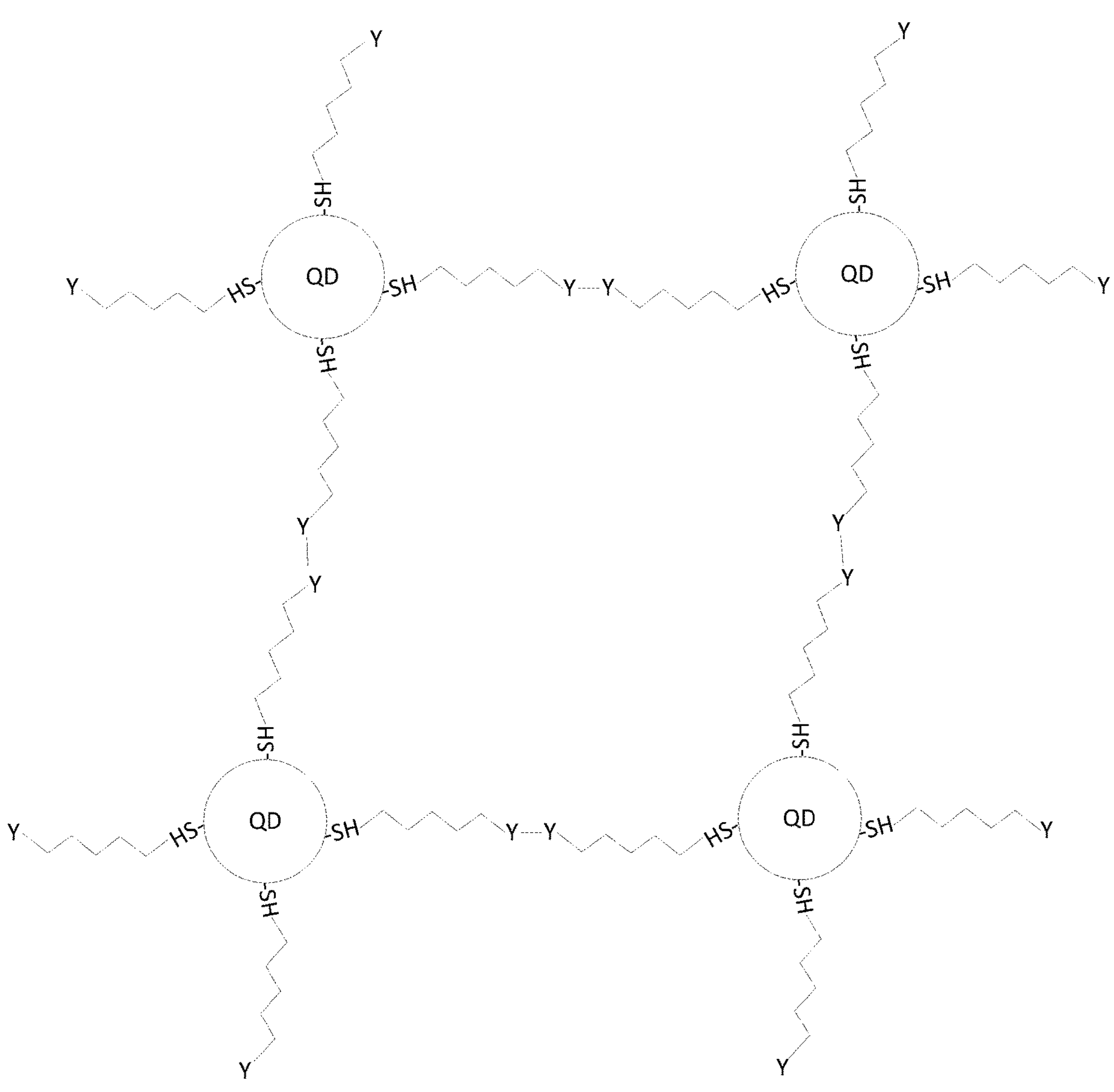
FIG. 3A is a schematic diagram of a crosslinking reaction between quantum dots.
Figures 3B, 4A:
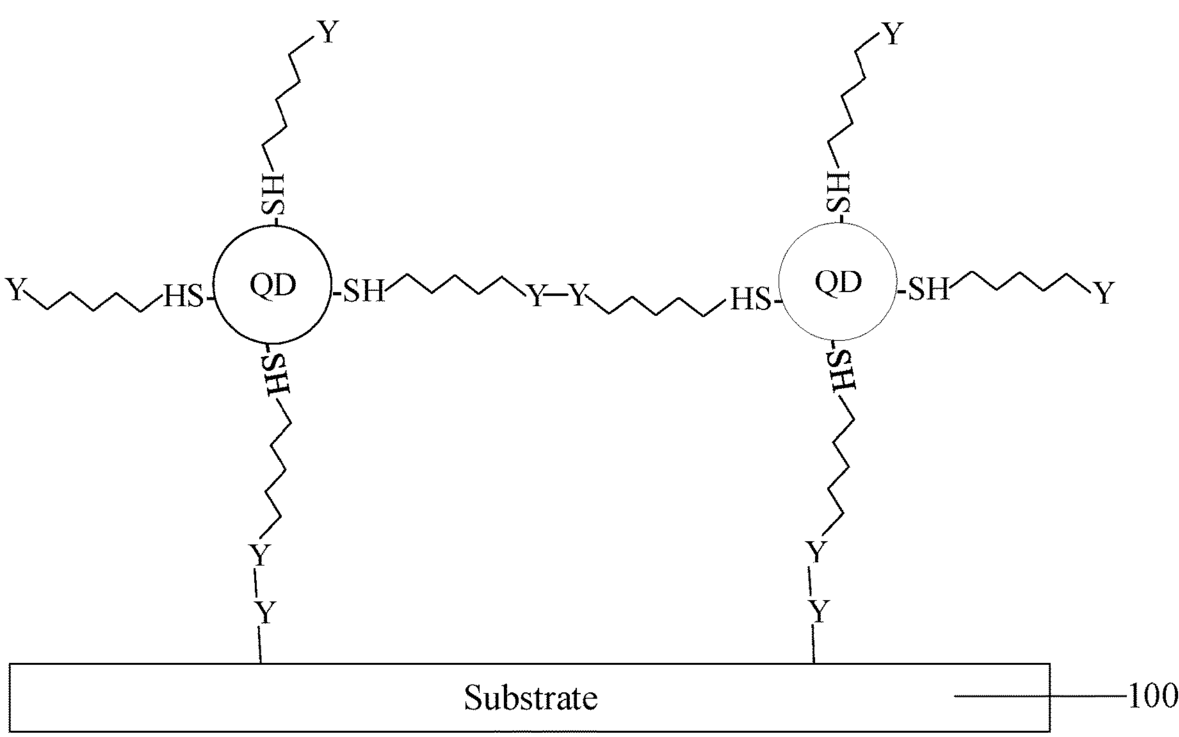
FIG. 3B is a schematic diagram of a crosslinking reaction between quantum dots and a substrate.
FIGS. 4A-4F are schematic diagrams of a manufacturing method for a quantum dot light-emitting device according to an embodiment of the present disclosure after each step is performed.

In specific implementation, the first crosslinkable ligands are subjected to the crosslinking reaction at the first temperature, wherein the crosslinking reaction may be crosslinking between the first crosslinkable ligands of the quantum dots or crosslinking between the first crosslinkable ligands of the quantum dots and second crosslinkable ligands of the substrate. In some embodiments, the crosslinking between the first crosslinkable ligands of the quantum dots is as shown in FIG. 3A; and the crosslinking between the first crosslinkable ligands of the quantum dots and the second crosslinkable ligands of a substrate 100 is as shown in FIG. 3B, and the surface of the substrate 100 has second crosslinkable ligands that undergo a crosslinking reaction with the first crosslinkable ligands (described later).

It should be noted that a principle that an electroluminescent device emits light is as follows: holes at an anode and electrons at a cathode are transported to a quantum dot layer to be recombinated for emitting light, due to the difference in energy level barriers between the anode and a light-emitting layer as well as between the cathode and the light-emitting layer, electron and hole transport is difficult and the transport rates and quantities are also very different, in order to balance the concentration of electrons and holes, a hole injection layer, a hole transport layer and the like are therefore generally arranged between the quantum dot layer and the anode, and an electron transport layer and the like are therefore generally arranged between the quantum dot layer and the cathode, and of course, in specific implementation, it is possible to select which layers are needed according to actual needs.

Currently, an electroluminescent device can be divided into an electroluminescent device of an upright structure and an electroluminescent device of an inverted structure, which differ in the order in which film layers are manufactured. Specifically, for the upright structure, an anode, a hole injection layer, a hole transport layer, a light-emitting layer, an electron transport layer and a cathode are sequentially formed on a substrate, and for the inverted structure, a cathode, an electron transport layer, a light-emitting layer, a hole transport layer, a hole injection layer and an anode are sequentially formed on a substrate.

The quantum dot light-emitting device provided by some embodiments of the present disclosure may be of an upright structure or an inverted structure, which is not limited.

A manufacturing method when the quantum dot light-emitting device provided by the embodiment of the present disclosure is of the inverted structure is simply illustrated below by specific embodiments, and of course, the embodiment of the present disclosure is also applicable to a manufacturing method of the upright structure. Specifically, manufacturing methods of film layers in the quantum dot light-emitting device include, but are not limited to, one or more of a spin coating method, an evaporation method, a chemical vapor deposition method, a physical vapor deposition method, a magnetron sputtering method, and the like.

In one exemplary embodiment: a crosslinking reaction occurs between the first crosslinkable ligands of the quantum dots at a first temperature.

In specific implementation, in the above manufacturing method provided by some embodiments of the present disclosure, before coating the substrate with the quantum dot solution, the method further includes: forming the substrate; forming the substrate may specifically include:

as shown in FIG. 4A, sequentially forming a first electrode 2 (taking the condition that the first electrode 2 is a cathode as an example) and a carrier film layer 3 (taking the condition that the carrier film layer 3 is an electron transport layer as an example) on a base substrate 1; wherein the surface of the carrier film layer 3 is free of a crosslinkable ligand. In some embodiments, manufacturing methods of the cathode and the electron transport layer are the same as those in the related art, which will not be detailed here; the base substrate 1 can be glass, or a flexible PET substrate, and a material of the cathode can be a transparent metal oxide conductive material, such as ITO (indium tin oxide), AZO (aluminum-doped zinc oxide), and IGZO (indium gallium zinc oxide); and a material of the electron transport layer may be ZnO, ZnMgO or the like.

Figure 4B:
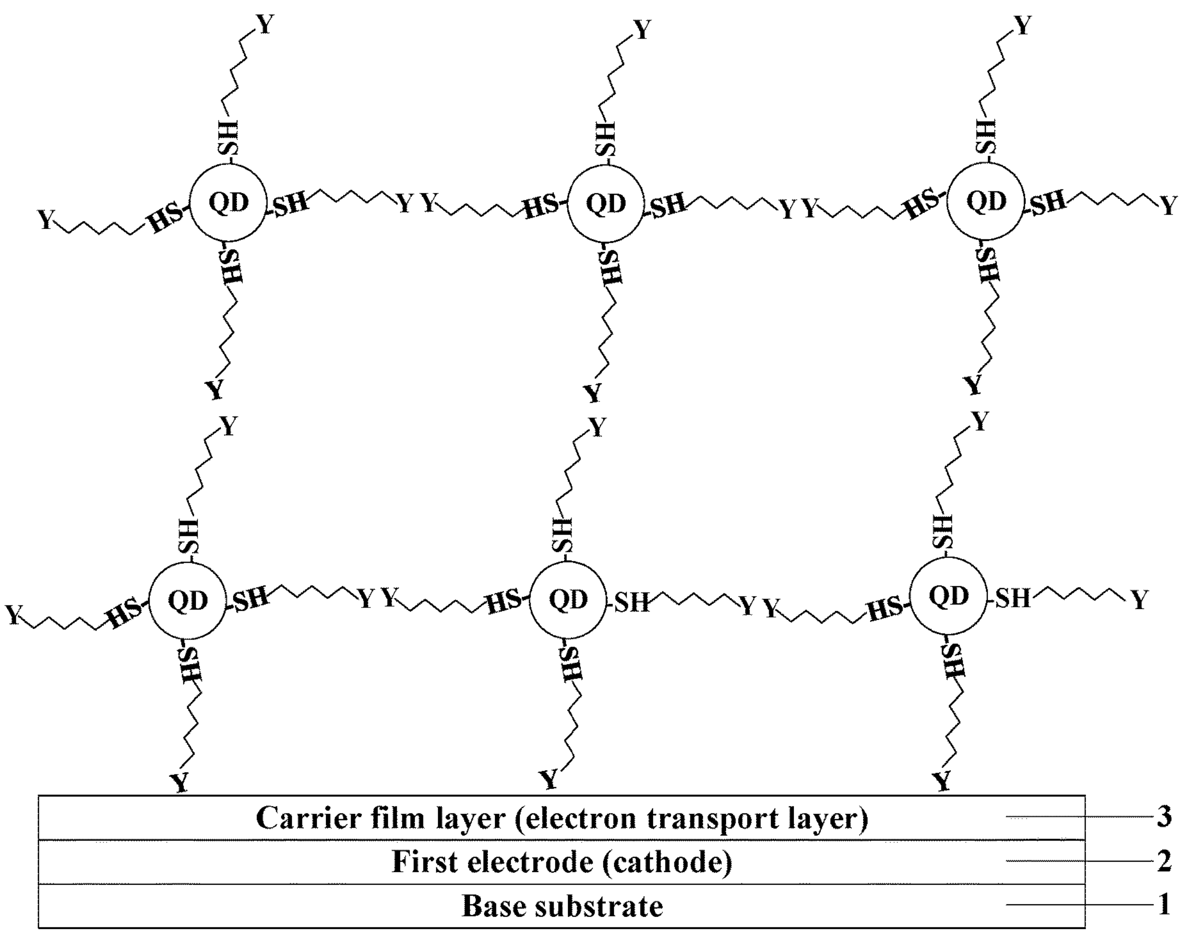

Next, as shown in FIG. 4B, the substrate formed with the carrier film layer 3 is heated to a second temperature (laser irradiation), the carrier film layer 3 is coated with a solution of quantum dots having a structure shown in FIG. 2B, and the first crosslinkable groups Y are in a decrosslinking state.

Next, the crosslinking reaction occurs between the first crosslinkable ligands of the quantum dots at the first temperature, which is specifically as follows.

Figure 4C:
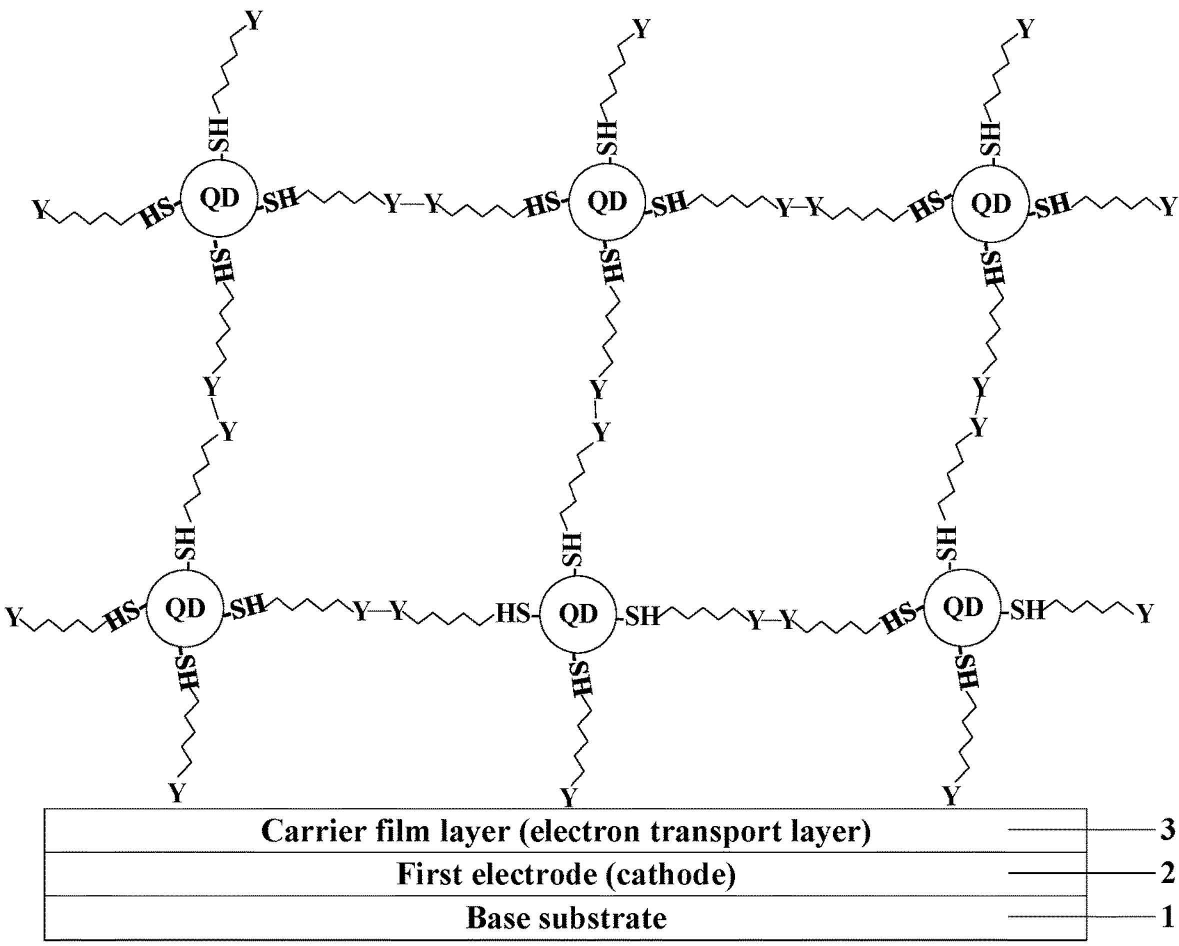
Figure 4D:
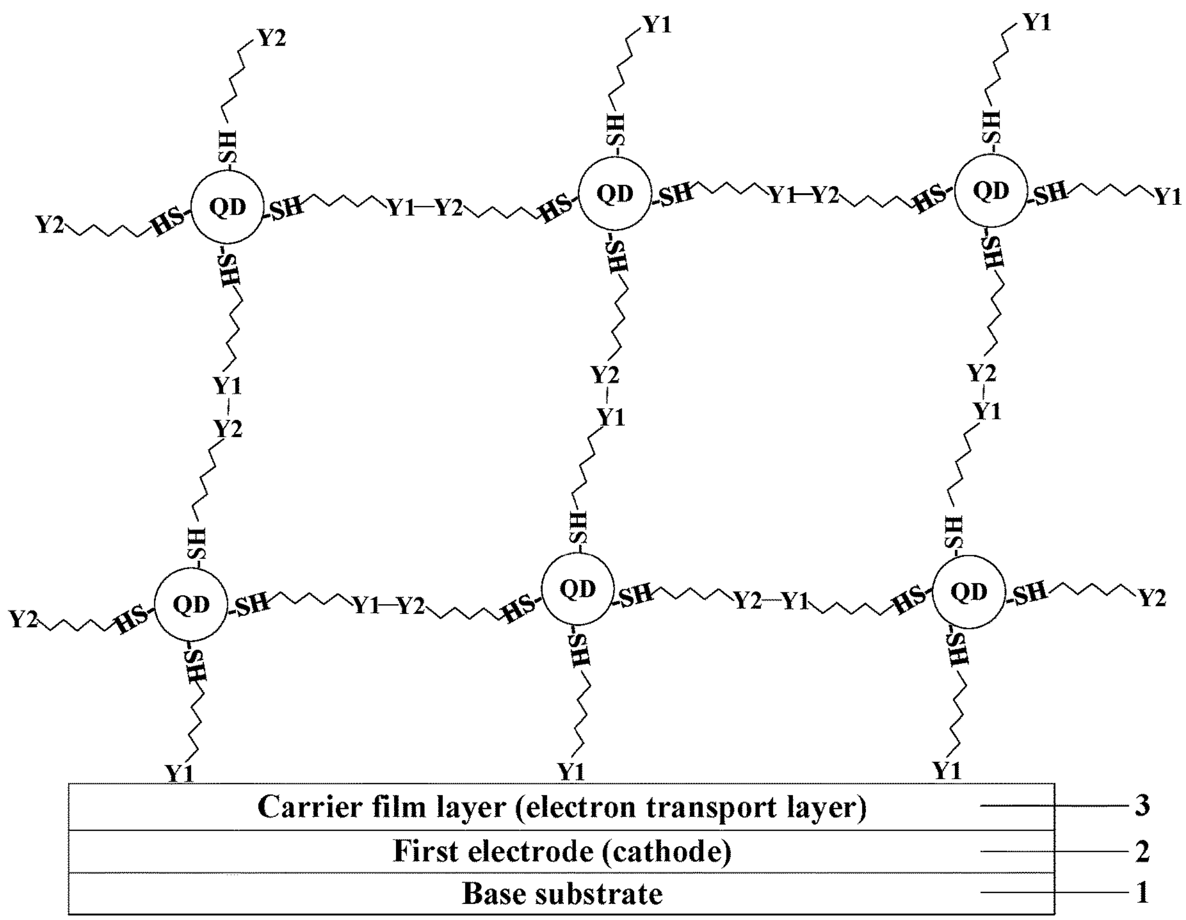

As shown in FIGS. 4C and 4D, FIGS. 4C and 4D show two parallel solutions, one of which can be selected; and a crosslinking reaction occurs between the first crosslinkable ligands corresponding to adjacent quantum dots at the first temperature (normal temperature), specifically, a crosslinking reaction occurs between the first crosslinkable groups Y.

In some embodiments, the quantum dots shown in FIG. 4C may include only the first crosslinkable groups Y, and a schematic diagram of a crosslinking reaction between first crosslinkable groups Y corresponding to adjacent quantum dots is shown; specifically, each first crosslinkable group Y includes, but is not limited to, at least one of: cyclopentadiene, a cyclopentadiene derivative, dicyclopentadiene, a dicyclopentadiene derivative or bisphenol p-aminolactone; taking the condition that each first crosslinkable group Y is a cyclopentadiene derivative

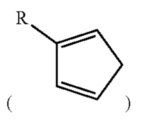

as an example, the quantum dots include only one type of crosslinkable ligands

Figure 5:
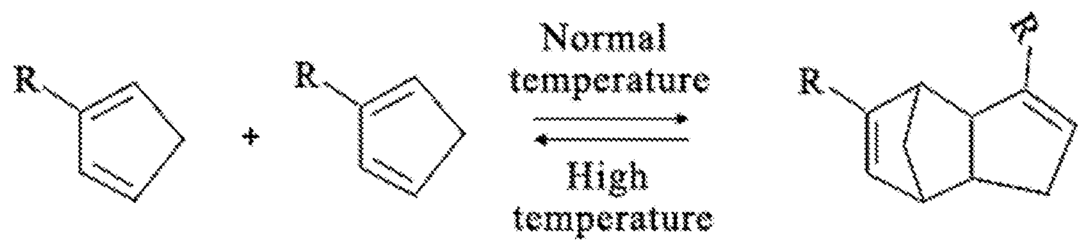
FIG. 5 is a schematic principle diagram of a crosslinking reaction between quantum dots according to an embodiment of the present disclosure.

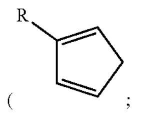

wherein R can be, but is not limited to, alkane groups such as methyl, ethyl, n-butyl, isobutyl, etc., a schematic principle diagram of a crosslinking reaction and a decrosslinking reaction of the cyclopentadiene derivative is shown in FIG. 5, wherein the high temperature represents a temperature generated by laser irradiation.

In some embodiments, the first crosslinkable groups Y of at least one quantum dot shown in FIG. 4D may include first groups Y1 and second groups Y2, a schematic diagram of a crosslinking reaction between the first groups Y1 and the second groups Y2 corresponding to adjacent quantum dots is shown; in particular, each first group Y1 can be maleimide or a derivative thereof, and each second group Y2 can be furan or a derivative thereof; or, each first group Y1 can be maleic anhydride or a derivative thereof, and each second group Y2 can be polyol; or, each first group Y1 can be maleimide and each second group Y2 can be furfuryl ester.

Taking the condition that each first group Y1 can be a maleimide derivative

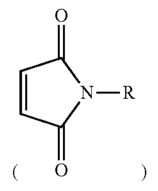

and each second group Y2 can be a furan derivative

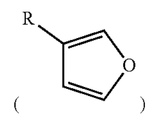

as an example, each quantum dot include two crosslinkable ligands

Figure 6:
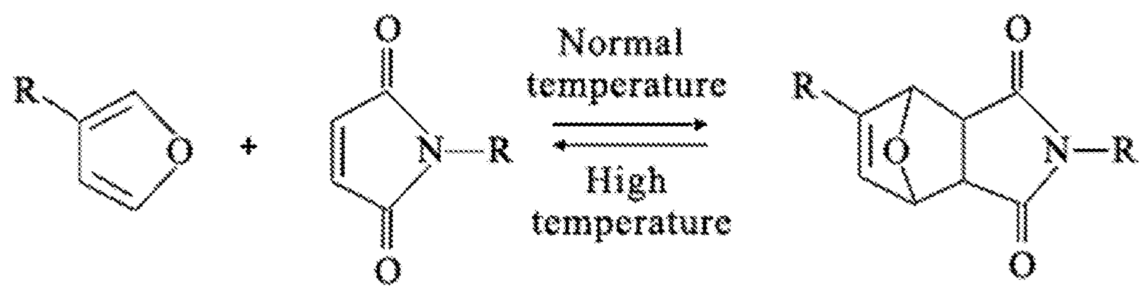
FIG. 6 is a schematic principle diagram of yet another crosslinking reaction between quantum dots according to an embodiment of the present disclosure.

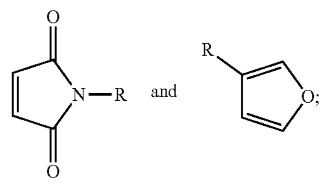

wherein R may be, but is not limited to, alkane groups such as methyl, ethyl, n-butyl, isobutyl, etc., and a schematic principle diagram of a crosslinking reaction and a decrosslinking reaction of the maleimide derivative and the furan derivative is as shown in FIG. 6, wherein the high temperature represents a temperature generated by laser irradiation.

In specific implementation, in the above manufacturing method provided by the embodiment of the present disclosure, when the first crosslinkable groups Y include the first groups Y1 and the second groups Y2, in order to improve the uniformity of patterning of the quantum dot layer, a mole number of the first groups Y1 corresponding to at least one quantum dot is identical to a mole number of the second groups Y2 corresponding to at least one quantum dot.

Figure 4E:
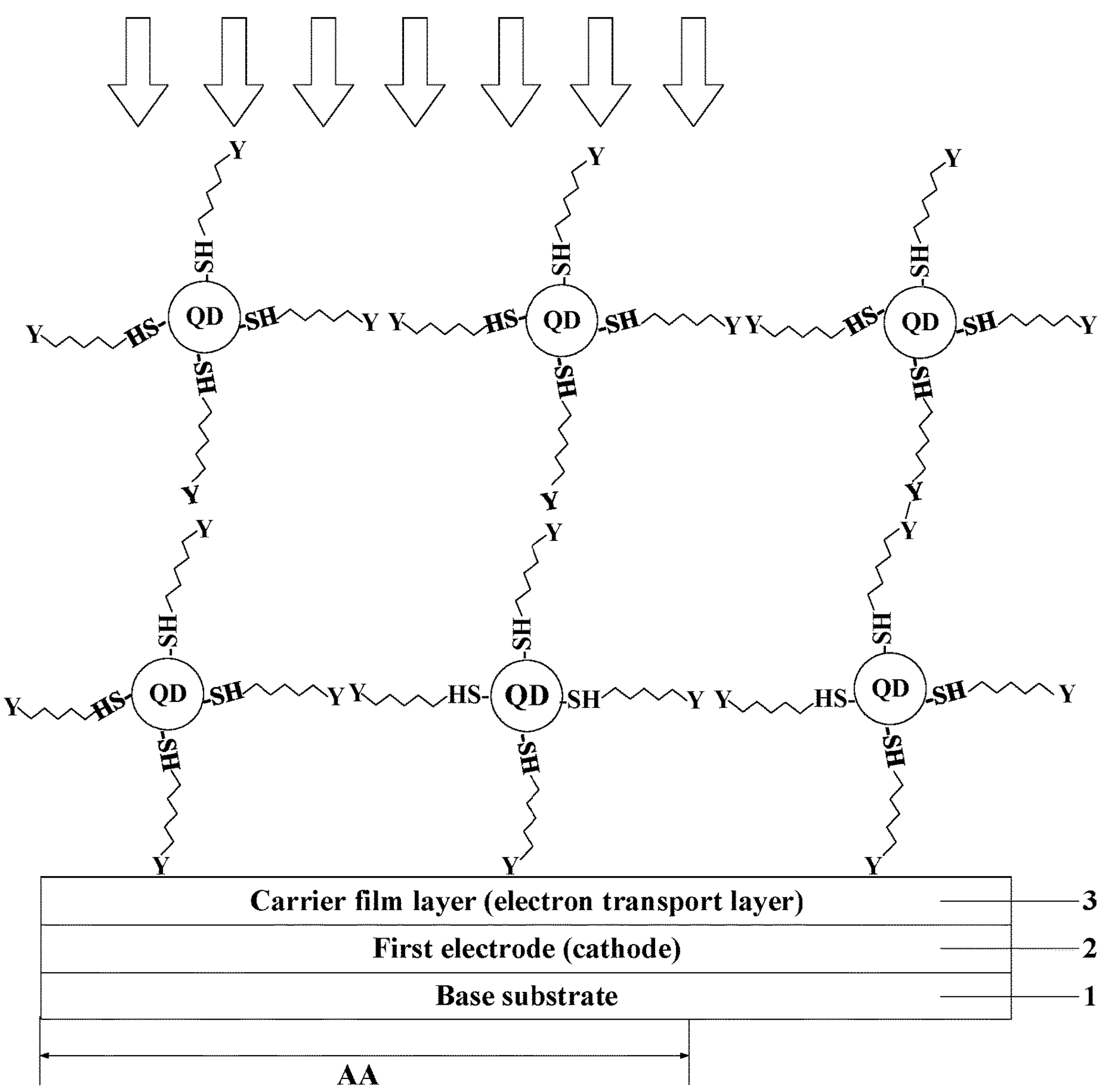

Next, as shown in FIG. 4E, a quantum dot region AA to be removed after the crosslinking reaction shown in FIG. 4C is irradiated (shown by arrows) with laser, and the quantum dots in the region AA to be removed are decrosslinked at a second temperature (e.g., 170° C.) generated by laser irradiation.

Figure 4F:
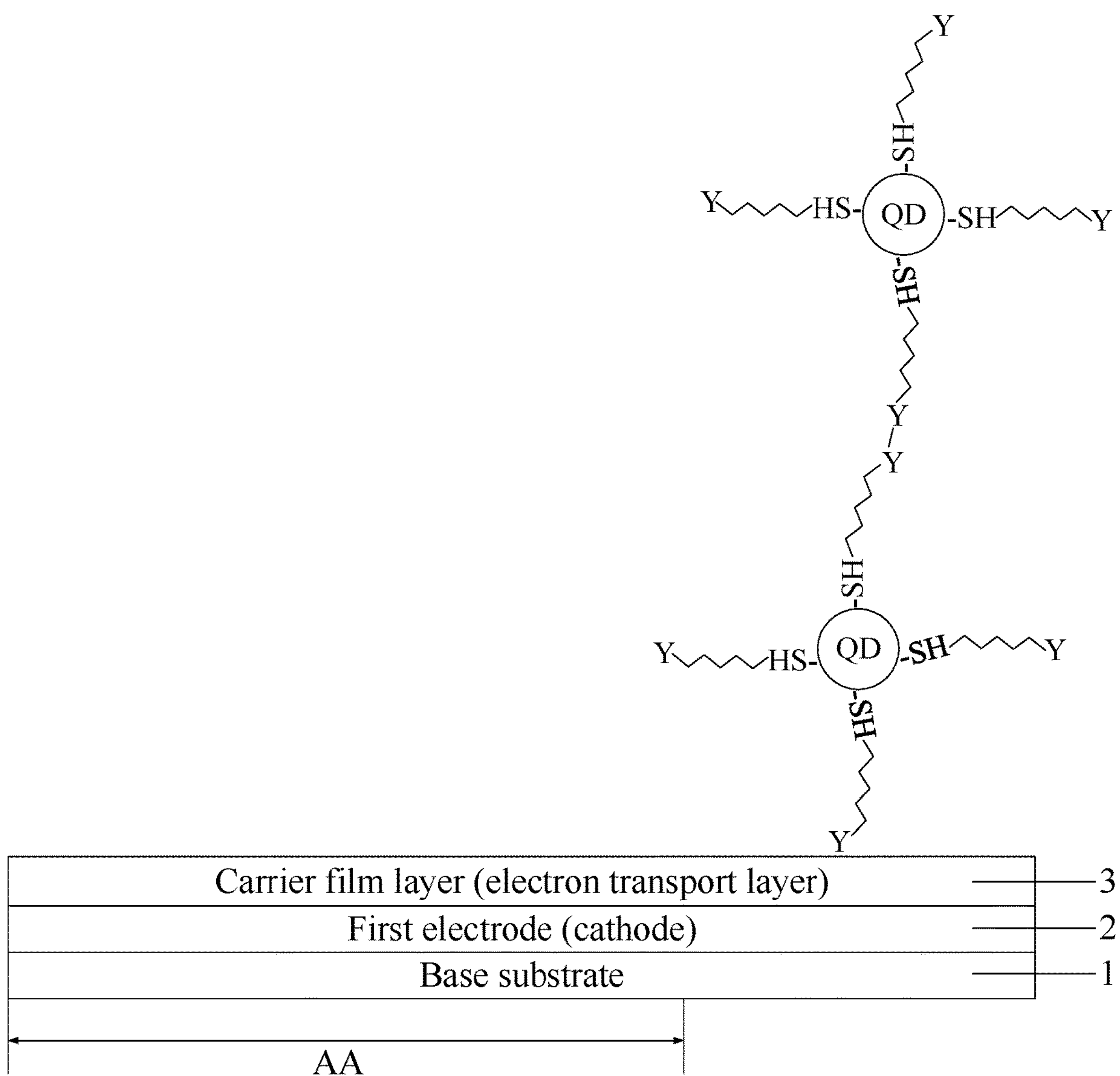

As shown in FIG. 4F, the quantum dots in the region AA to be removed are removed, and specifically, the quantum dots after being irradiated with the laser can be washed with a solvent, wherein the quantum dots in the region AA to be removed are dissolved in the solvent, and the quantum dots subjected to the crosslinking reaction are not dissolved in the solvent, thereby forming a patterned quantum dot layer 4.

In another exemplary embodiment: a crosslinking reaction occurs between the first crosslinkable ligands of the quantum dots and the second crosslinkable ligands on the substrate at a first temperature.

Figure 7A:
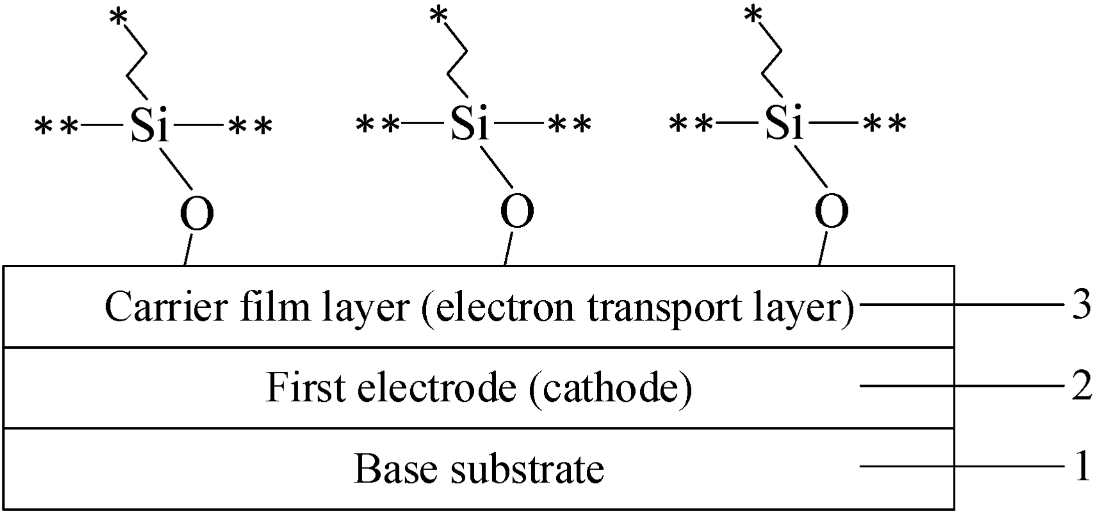
FIGS. 7A-7F are schematic diagrams of yet another manufacturing method for a quantum dot light-emitting device according to an embodiment of the present disclosure after each step is performed.

In specific implementation, in the above manufacturing method provided by some embodiments of the present disclosure, before coating the substrate with the quantum dot solution, the method further includes: forming the substrate; forming the substrate may specifically include:

as shown in FIG. 7A, sequentially forming a first electrode 2 (taking the condition that the first electrode 2 is a cathode as an example) and a carrier film layer 3 (taking the condition that the carrier film layer 3 is an electron transport layer as an example) on a base substrate 1; wherein second crosslinkable ligands are connected to the surface of the carrier film layer 3, and each second crosslinkable ligand includes: second connecting groups D2 connected to the surface of the carrier film layer 3, and second crosslinkable groups P connected to the second connecting groups D2. Specifically, manufacturing methods of the cathode and the electron transport layer are the same as those in the prior art, which will not be detailed here; the base substrate 1 can be glass, or a flexible PET substrate, and a material of the cathode can be a transparent metal oxide conductive material, such as ITO (indium tin oxide), AZO (aluminum-doped zinc oxide), and IGZO (indium gallium zinc oxide); and a material of the electron transport layer may be ZnO, ZnMgO or the like.

In some embodiments, as shown in FIG. 7A, the carrier film layer 3 may be an electron transport layer, and a structure of each second connecting group D2 may be

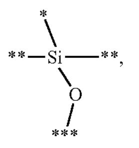

where * is a position connecting with the corresponding second crosslinkable group P,  is a position connecting with other groups (e.g., hydroxy, an alkane group, etc.), and * is a position connecting with the electron transport layer (3). In some embodiments, the electron transport layer (3) is generally ZnO, ZnMgO or the like, and the surface contains a large number of hydroxy, so it is necessary to adopt

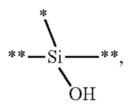

to react with the hydroxy on the surface of the electron transport layer, and the second crosslinkable groups P are then modified to the positions *, of course, which is limited thereto, as long as the second crosslinkable ligands can be modified to the surface of the carrier film layer 3.

Figure 7B:
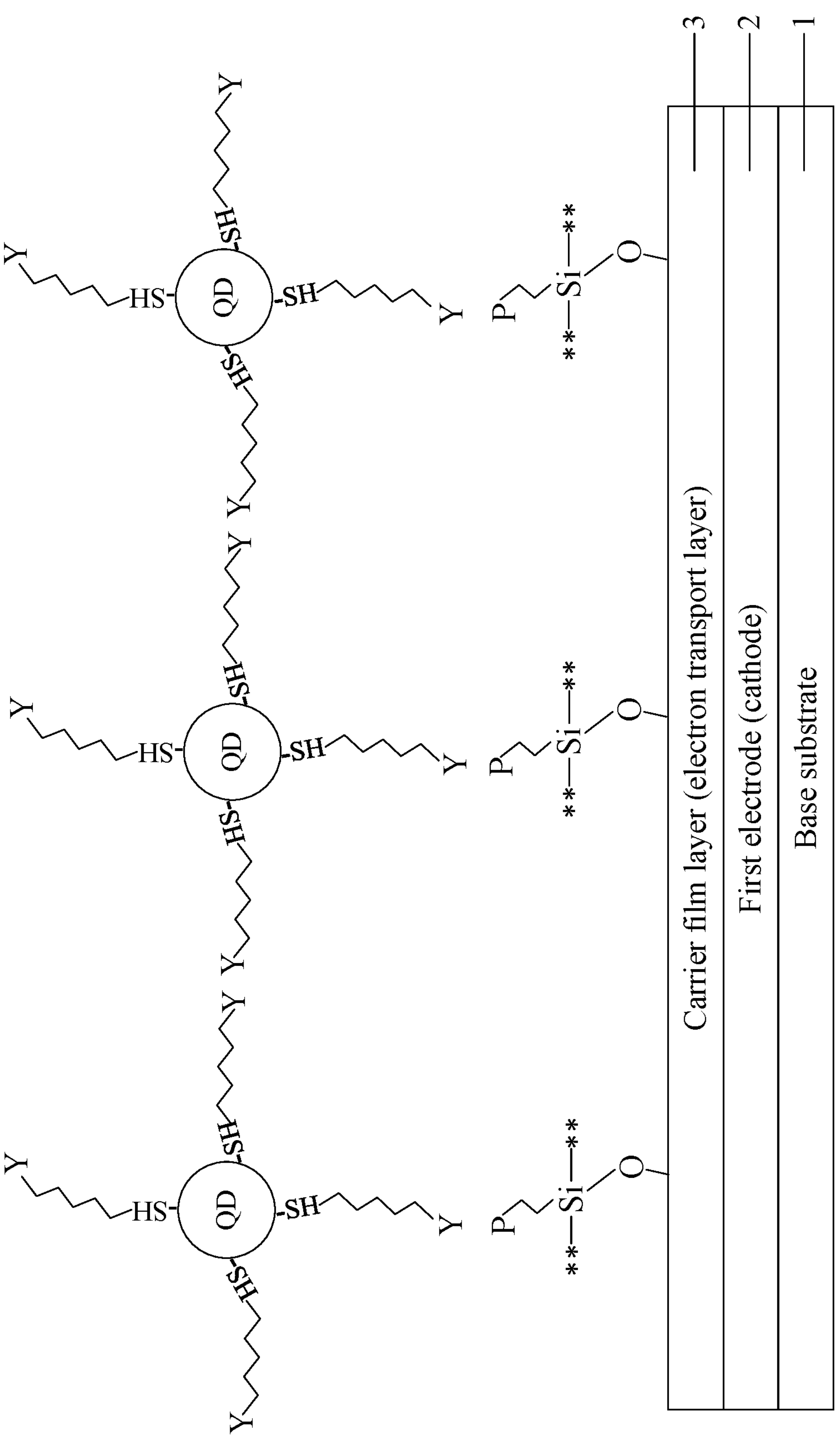

Next, as shown in FIG. 7B, the substrate formed with the carrier film layer 3 is heated to a second temperature (laser irradiation), the carrier film layer 3 is coated with a solution of quantum dots having a structure shown in FIG. 2B, and the first crosslinkable groups Y are in a decrosslinking state.

Next, the crosslinking reaction occurs between the first crosslinkable ligands of the quantum dots and the second crosslinkable ligands on the substrate at the first temperature, which is specifically as follows.

Figure 7C:
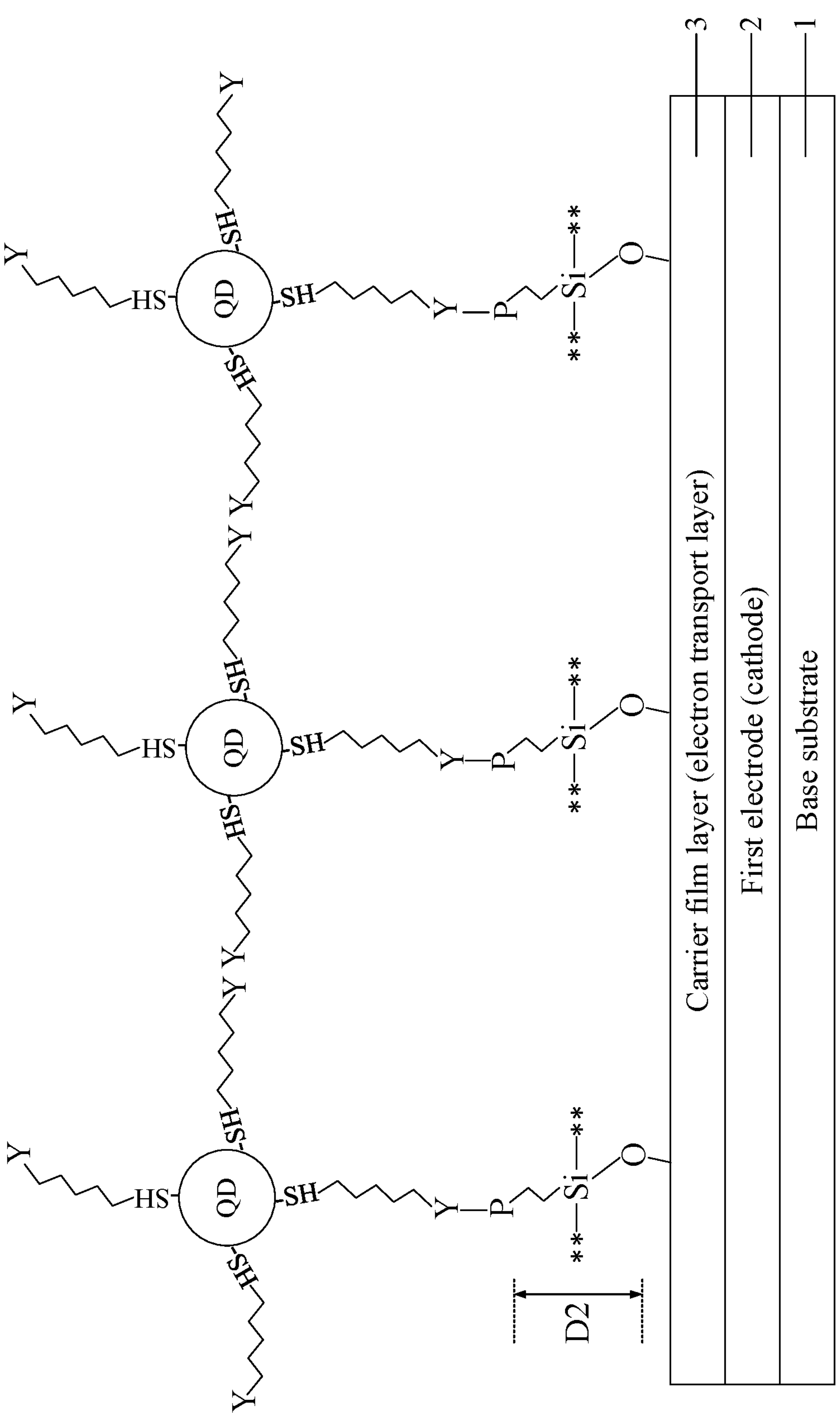
Figure 7D:
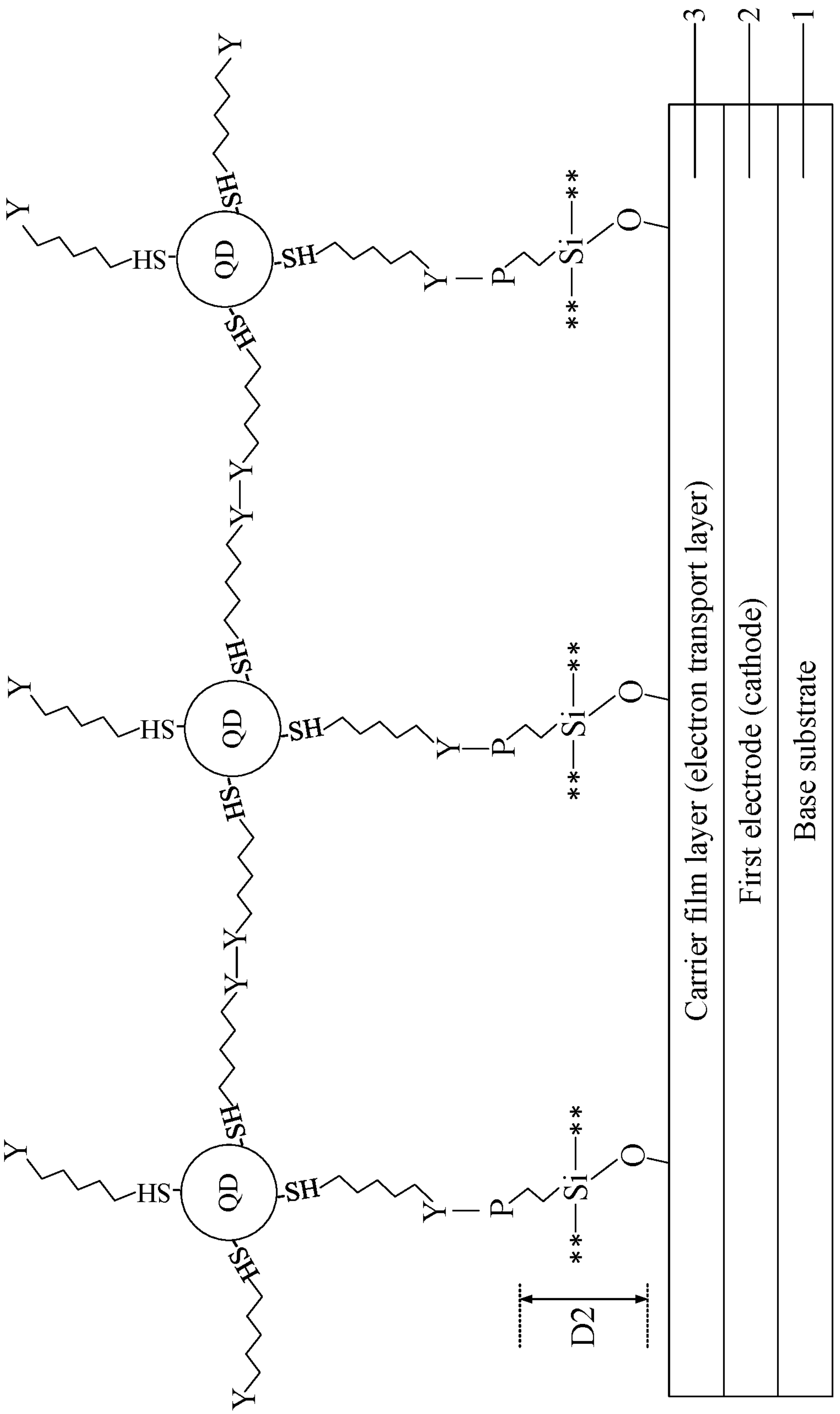

As shown in FIG. 7C, the first crosslinkable ligands of the quantum dots and the second crosslinkable ligands are subjected to a crosslinking reaction at the first temperature (normal temperature), specifically, the first crosslinkable groups Y and the second crosslinkable groups P are subjected to a crosslinking reaction; or, as shown in FIG. 7D, the first crosslinkable ligands of the quantum dots and the second crosslinkable ligands are subjected to a crosslinking reaction at the first temperature (the normal temperature), while a crosslinking reaction occurs between the first crosslinkable ligands corresponding to adjacent quantum dots, specifically, a crosslinking reaction occurs between the first crosslinkable groups Y and the second crosslinkable groups P, while a crosslinking reaction occurs between first crosslinkable groups Y corresponding to adjacent quantum dots. FIGS. 7C and 7D show two possible solutions, one of which can be selected.

In some embodiments, both the first crosslinkable groups Y and the second crosslinkable groups P may be cyclopentadiene or a derivative thereof; or, both the first crosslinkable groups Y and the second crosslinkable groups P may be dicyclopentadiene or a derivative thereof; or, both the first crosslinkable groups Y and the second crosslinkable groups P may be bisphenol p-aminolactone; or, one of the first crosslinkable group Y and the second crosslinkable group P is maleimide and the other is furan; or, one of the first crosslinkable group Y and the second crosslinkable group P is maleic anhydride or a derivative thereof, and the other is polyol; or, one of the first crosslinkable group Y and the second crosslinkable group P is maleimide and the other is furfuryl ester.

Figure 7E:
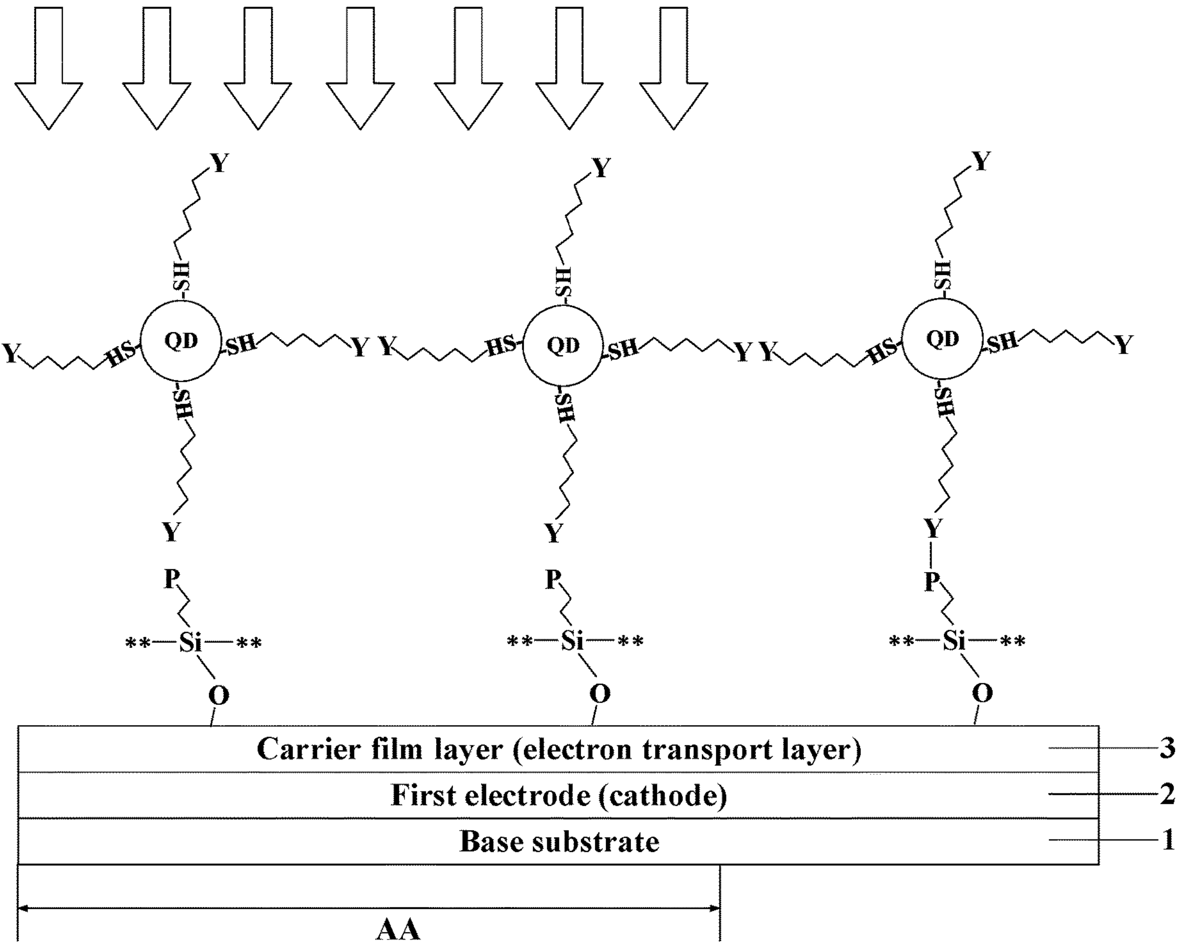

Next, as shown in FIG. 7E, a quantum dot region AA to be removed after the crosslinking reaction is irradiated (shown by arrows) with laser, the quantum dots in the region AA to be removed being decrosslinked at a second temperature (e.g., 170° C.) generated by laser irradiation.

Figure 7F:
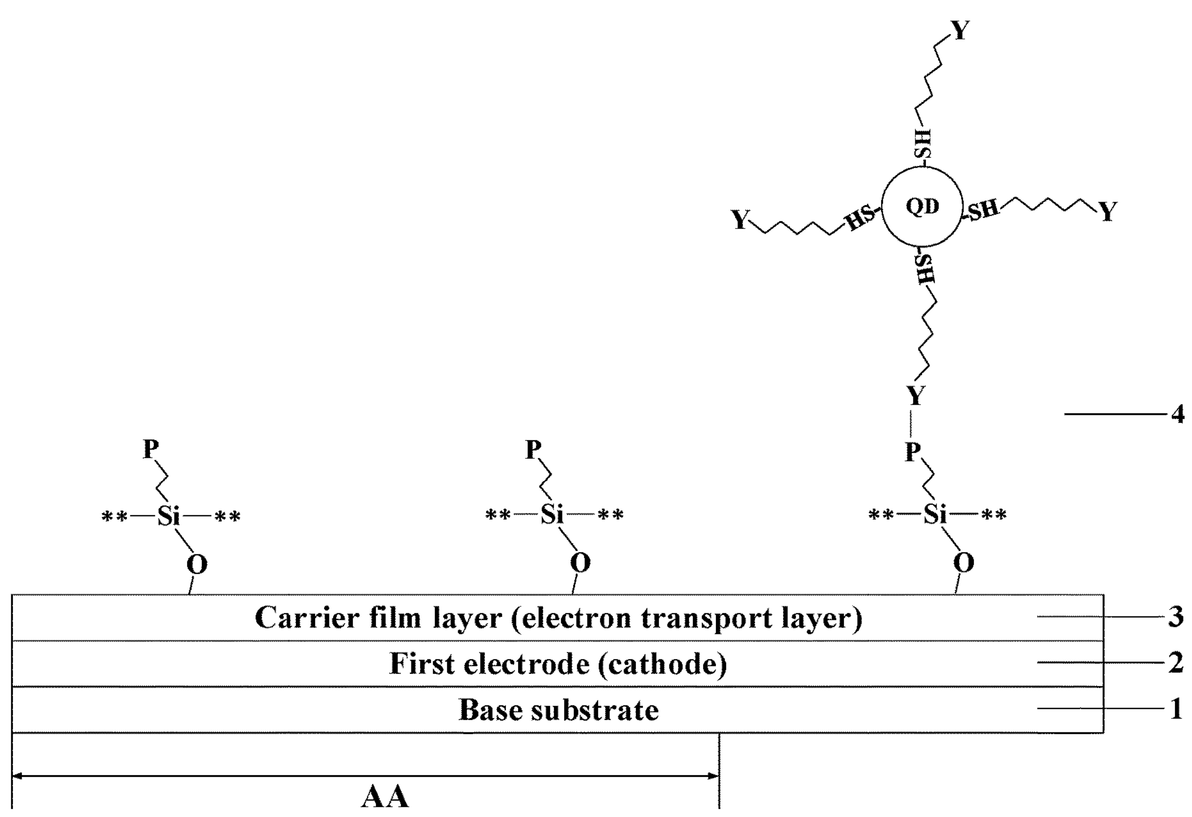

As shown in FIG. 7F, the quantum dots in the region AA to be removed are removed, and specifically, the quantum dots after being irradiated with the laser can be washed with a solvent, wherein the quantum dots in the region AA to be removed are dissolved in the solvent, and the quantum dots subjected to the crosslinking reaction are not dissolved in the solvent, thereby forming a patterned quantum dot layer 4.

To achieve full color display, a quantum dot layer generally includes patterned quantum dots of different colors, the embodiment of the present disclosure takes the condition that the quantum dot layer includes a first quantum dot layer, a second quantum dot layer and a third quantum dot layer as an example, in specific implementation, the color of light emitted by the first quantum dot layer, the color of light emitted by the second quantum dot layer, the color of light emitted by the third quantum dot layer in the embodiment of the present disclosure are red, green and blue, respectively, so in the embodiment of the present disclosure, the first quantum dot layer, the second quantum dot layer and the third quantum dot layer can be manufactured by the above method for patterning the quantum dot layer, for example, FIGS. 4A-4F or FIGS. 7A-7F show the steps of manufacturing the first quantum dot layer, the steps of manufacturing the second quantum dot layer continue to be completed according to the corresponding steps of FIGS. 4A-4F or FIGS. 7A-7F, and manufacturing the second quantum dot layer is different from manufacturing the first quantum dot layer in that the quantum dots are green quantum dots and the position of laser irradiation is different; and the third quantum dot layer is finally manufactured, the steps of manufacturing the third quantum dot layer continue to be completed according to the corresponding steps of FIGS. 4A-4F or FIGS. 7A-7F, and manufacturing the third quantum dot layer is different from manufacturing the first quantum dot layer and the second quantum dot layer in that the quantum dots are blue quantum dots and the position of laser irradiation is different, thereby completing the patterning process of full-color quantum dots.

In summary, in some embodiments of the present disclosure, the patterning of the quantum dot layer can be completed without using an inkjet printing method or a photolithography method, and quantum dots with high resolution and good performance can be formed.

Figure 8:
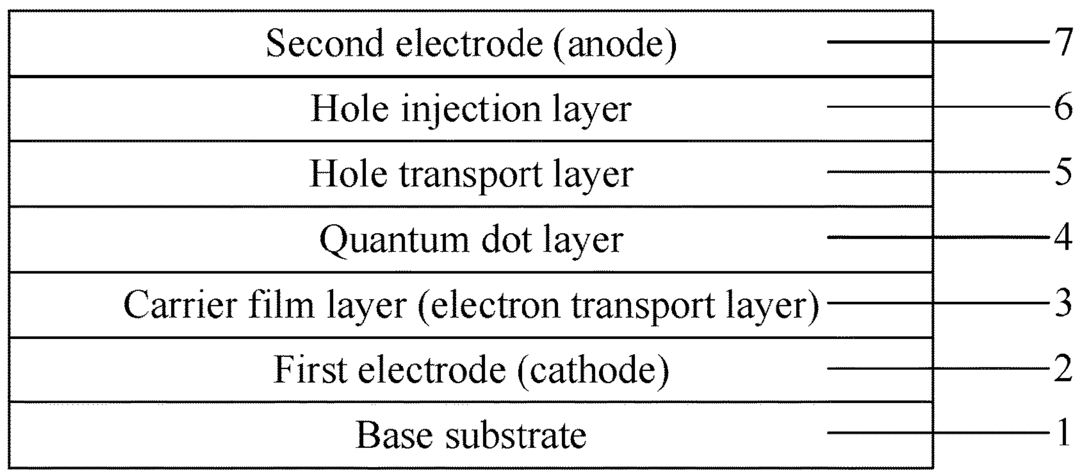
FIG. 8 is a schematic structural diagram of a quantum dot light-emitting device provided by an embodiment of the present disclosure.

After the patterned quantum dot layer of different colors is formed, a hole transport layer 5 is formed on the quantum dot layer 4, a hole injection layer 6 is formed on the hole transport layer 5, a second electrode 7 (an anode) is formed on the hole injection layer 6, as shown in FIG. 8.

After the manufacture of the above film layers is finished, a packaging process, a cutting process, and a bonding process of the quantum dot light-emitting device are further included, completing the manufacture of the quantum dot light-emitting device of the inverted structure in the embodiment of the present disclosure, and these processes are the same as those in the related art, which will not be repeated here.

In the present disclosure, there are no restrictions on the light-emitting type of the quantum dot light-emitting device, for example, being not limited to bottom light emission or top light emission. In specific implementation, the electrode located on a light-emitting side of the quantum dot light-emitting device in the anode and the cathode is a transparent electrode.

Specifically, the substrate provided by some embodiments of the present disclosure further includes a driving circuit located between the base substrate and the first electrode, and structures such as a passivation layer and a flattening layer located between the driving circuit and the first electrode.

It should be noted that embodiments of the present disclosure mainly takes a light-emitting device of an inverted structure as an example to describe the quantum dot light-emitting device and the manufacturing method therefor in detail. Of course, the embodiment of the present disclosure is also applicable to the quantum dot light-emitting device of an upright structure and the manufacturing method therefor, a structure of the quantum dot light-emitting device of the upright structure is as shown in FIG. 9, including a second electrode (an anode) 7, a hole injection layer 6, a carrier film layer (a hole transport layer) 5, a quantum dot layer 4, an electron transport layer 3 and a first electrode (a cathode) 2 which are sequentially stacked on a substrate 100, and its manufacturing method is the same as that of the quantum dot light-emitting device of the inverted structure when the quantum dots are crosslinked; and when crosslinking occurs between the quantum dots and the substrate, the carrier film layer is a hole transport layer, and modification of the hole transport layer is required so that the hole transport layer is connected with second crosslinkable ligands.

Figure 9:
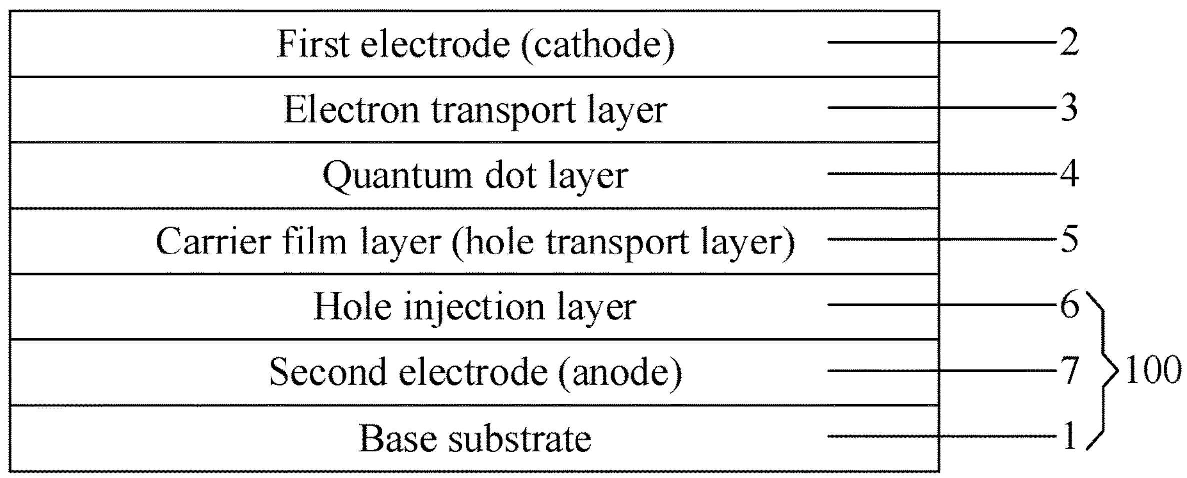
FIG. 9 is a schematic structural diagram of yet another quantum dot light-emitting device provided by an embodiment of the present disclosure.

Based on the same inventive concept, an embodiment of the present disclosure further provides a quantum dot light-emitting device, as shown in FIG. 8 and FIG. 9, including a substrate 100 and a patterned quantum dot layer 4 located on the substrate 100; as shown in FIG. 2A, each quantum dot of the quantum dot layer 4 includes a quantum dot body QD and a first crosslinkable ligand connected to the surface of the quantum dot body QD; and the quantum dot layer 4 is of a structure obtained after the first crosslinkable ligands are subjected to a crosslinking reaction at a first temperature.

In specific implementation, in the above quantum dot light-emitting device provided by some embodiments of the present disclosure, as shown in FIG. 2A, each first crosslinkable ligand includes: coordination groups X which are subjected to coordination binding with the corresponding quantum dot body QD, first connecting groups D1 connected with the coordination groups X, and first crosslinkable groups Y connected with the first connecting groups D1.

As shown in FIG. 4F, the quantum dot layer 4 is of a structure obtained after a crosslinking reaction occurs between first crosslinkable groups Y corresponding to adjacent quantum dots.

In specific implementation, in the above quantum dot light-emitting device provided by some embodiments of the present disclosure, as shown in FIG. 4C, each first crosslinkable group Y includes, but is not limited to, at least one of: cyclopentadiene, a cyclopentadiene derivative, dicyclopentadiene, a dicyclopentadiene derivative or bisphenol p-aminolactone; or, as shown in FIG. 4D, the first crosslinkable groups Y corresponding to the at least one quantum dot includes first groups Y1 and second groups Y2;

each first group Y1 can be maleimide or a derivative thereof, and each second group Y2 can be furan or a derivative thereof; or, each first group Y1 can be maleic anhydride or a derivative thereof, and each second group Y2 can be polyol; or, each first group Y1 can be maleimide and each second group Y2 can be furfuryl ester.

In specific implementation, in the above quantum dot light-emitting device provided by some embodiments of the present disclosure, as shown in FIG. 4D, when the first crosslinkable groups Y include the first groups Y1 and the second groups Y2, in order to improve the uniformity of patterning of the quantum dot layer, a mole number of the first groups Y1 corresponding to at least one quantum dot is identical to a mole number of the second groups Y2 corresponding to at least one quantum dot.

In specific implementation, in the above quantum dot light-emitting device provided by some embodiments of the present disclosure, as shown in FIG. 7C, FIG. 8 and FIG. 9, the substrate 100 includes: a base substrate 1, a first electrode 2 located on the base substrate 1, and a carrier film layer 3 located on the first electrode 2; wherein the quantum dot layer 4 is located on the carrier film layer 3, and second crosslinkable ligands are connected to the surface of the carrier film layer 3; and each second crosslinkable ligand includes: second connecting groups D2 connected to the surface of the carrier film layer 3, and second crosslinkable groups P connected to the second connecting groups D2.

As shown in FIG. 7C, the quantum dot layer 4 is of a structure obtained after the first crosslinkable ligands and the second crosslinkable ligands are subjected to a crosslinking reaction, specifically, the quantum dot layer 4 is of a structure obtained after the first crosslinkable groups Y and the second crosslinkable groups P are subjected to a crosslinking reaction; or, as shown in FIG. 7D, the quantum dot layer 4 is of a structure obtained after a crosslinking reaction occurs between the first crosslinkable ligands and the second crosslinkable ligands, and a crosslinking reaction occurs between first crosslinkable ligands corresponding to adjacent quantum dots, specifically, the quantum dot layer 4 is of a structure obtained after a crosslinking reaction occurs between the first crosslinkable groups Y and the second crosslinkable groups P, and a crosslinking reaction occurs between first crosslinkable groups Y corresponding to adjacent quantum dots.

In specific implementation, in the above quantum dot light-emitting device provided by some embodiments of the present disclosure, both the first crosslinkable groups Y and the second crosslinkable groups P may be cyclopentadiene or a derivative thereof; or, both the first crosslinkable groups Y and the second crosslinkable groups P may be dicyclopentadiene or a derivative thereof; or, both the first crosslinkable groups Y and the second crosslinkable groups P may be bisphenol p-aminolactone; or, one of the first crosslinkable group Y and the second crosslinkable group P is maleimide and the other is furan; or, one of the first crosslinkable group Y and the second crosslinkable group P is maleic anhydride or a derivative thereof, and the other is polyol; or, one of the first crosslinkable group Y and the second crosslinkable group P is maleimide and the other is furfuryl ester.

In specific implementation, in the above quantum dot light-emitting device provided by some embodiments of the present disclosure, as shown in FIGS. 7C and 7D, the carrier film layer 3 may be an electron transport layer, and a structure of each second connecting group D2 may be

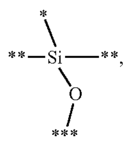

wherein * is a position connecting with the corresponding second crosslinkable group P,  is a position connecting with other groups (such as hydroxy, an alkane group, etc.), and * is a position connecting with the electron transport layer (3).

In specific implementation, in the above quantum dot light-emitting device provided by some embodiments of the present disclosure, as shown in FIG. 2A, each coordination group X includes, but is not limited to, at least one of $—NH_2$, —SH, —COOH, —P or $—PO_2$, and each first connecting group D1 is but not limited to $—(CH_2)_n—$, wherein n=2~6.

It should be noted that in FIG. 2B, FIG. 3A, FIG. 3B, FIG. 4B-FIG. 4F, and FIG. 7B-FIG. 7F, —SH or HS— refers to sulfhydryl, and —SH or HS— shown in these figures is arranged around the surfaces of the quantum dots QDs, thus being illustrated as —SH or HS—.

Based on the same inventive concept, an embodiment of the present disclosure further provides a display apparatus, including the above quantum dot light-emitting device provided by embodiments of the present disclosure.

In specific implementation, the display apparatus provided by embodiments of the present disclosure may be: any product or component having a display function, such as a mobile phone, a tablet computer, a television, a display, a notebook computer, a digital photo frame, a navigator and the like. Other essential components of the display apparatus should be understood by those of ordinary skill in the art, and will not be repeated here, nor should they be regarded as a limitation to the present disclosure. The implementation of the display apparatus can refer to the above embodiment of the quantum dot light-emitting device, which will not be repeated.

In specific implementation, the display apparatus provided by embodiments of the present invention may further include other functional film layers well known to those skilled in the art, which will not be described in detail here.

According to the quantum dot light-emitting device and the manufacturing method therefor, and the display apparatus provided by the embodiments of the present disclosure, the substrate is coated with the quantum dot solution in which the first crosslinkable ligands are in the decrosslinking state, the first crosslinkable ligands of the quantum dots are subjected to the crosslinking reaction at the first temperature, and the quantum dots which are subjected to the crosslinking reaction have a network structure, are more stable, are difficult to dissolve in a solvent, and remain on the substrate; the quantum dot region to be removed after the crosslinking reaction is then irradiated with the laser, the quantum dots in the region to be removed are decrosslinked at the second temperature generated by laser irradiation, the decrosslinked quantum dots can be dissolved in a solvent, and thus the quantum dots after being irradiated by the laser can be washed with the solvent to remove the quantum dots in the region to be removed to form the patterned quantum dot layer, that is, patterning of the quantum dot layer is completed; and compared with the prior art, the method of the present disclosure can complete the patterning of the quantum dot layer without using an inkjet printing method or a photolithography method, and can form quantum dots with high resolution and good performance.

Although the preferred embodiments of the present disclosure have been described, those skilled in the art can make additional changes and modifications to these embodiments once they know the basic inventive concepts. Therefore, the appended claims are intended to be explained as including the preferred embodiments and all changes and modifications falling within the scope of the present disclosure.

Obviously, those skilled in the art can make various changes and modifications to the embodiments of the present disclosure without departing from the spirit and scope of the embodiments of the present disclosure. Thus, if these changes and modifications of the embodiments of the present disclosure fall within the scope of the claims of the present disclosure and their equivalents, the present disclosure is also intended to include these changes and modifications.

What is claimed is:

1. A manufacturing method for a quantum dot light-emitting device, comprising:

coating a substrate with a quantum dot solution; wherein each quantum dot comprises a quantum dot body and a first crosslinkable ligand connected to a surface of the quantum dot body; and in response to the quantum dots being in a solution state, the first crosslinkable ligands are in a decrosslinking state;

carrying out a crosslinking reaction on the first crosslinkable ligands of the quantum dots at a first temperature;

using laser to irradiate a quantum dot region to be removed after the crosslinking reaction, the quantum dots in the region to be removed being decrosslinked at a second temperature generated by laser irradiation; and a difference between the second temperature and the first temperature being greater than a preset value; and removing the quantum dots in the region to be removed to form a patterned quantum dot layer.

2. The manufacturing method according to claim 1, wherein before the coating the substrate with the quantum dot solution, the method further comprises: forming the substrate;

the forming the substrate, comprises:

sequentially forming a first electrode and a carrier film layer on a base substrate; wherein the surface of the carrier film layer is free of a crosslinkable ligand; and the carrying out the crosslinking reaction on the first crosslinkable ligand of the quantum dots at the first temperature, comprises:

carrying out a crosslinking reaction between first crosslinkable ligands corresponding to adjacent quantum dots.

3. The manufacturing method according to claim 2, wherein each first crosslinkable ligand comprises: coordination groups which are subjected to coordination binding with a corresponding quantum dot body, first connecting groups connected with the coordination groups, and first crosslinkable groups connected with the first connecting groups; and a crosslinking reaction occurs between the first crosslinkable groups.

4. The manufacturing method according to claim 3, wherein each first crosslinkable group comprises at least one of: cyclopentadiene, a cyclopentadiene derivative, dicyclopentadiene, a dicyclopentadiene derivative or bisphenol p-aminolactone; or, the first crosslinkable group corresponding to at least one of the quantum dots comprises a first group and a second group; wherein, the first group is maleimide and the second group is furan; or, the first group is maleic anhydride or a derivative thereof, and the second group is polyol; or, the first group is maleimide and the second group is furfuryl ester.

5. The manufacturing method according to claim 4, wherein a mole number of the first group corresponding to at least one of the quantum dots is identical to a mole number of the second group corresponding to at least one of the quantum dots.

6. The manufacturing method according to claim 3, wherein each coordination group comprises at least one of $—NH_2$, —SH, —COOH, —P or $—PO_2$, and each first connecting group is $—(CH_2)_n—$, wherein n=2~6.

7. The manufacturing method according to claim 1, wherein before the coating the substrate with the quantum dot solution, the method further comprises: forming the substrate;

the forming the substrate, comprises:

sequentially forming a first electrode and a carrier film layer on a base substrate; wherein second crosslinkable ligands are connected to the surface of the carrier film layer; and the carrying out the crosslinking reaction on the first crosslinkable ligand of the quantum dots at the first temperature, comprises:

carrying out a crosslinking reaction between the first crosslinkable ligands of the quantum dots and the second crosslinkable ligands; or, while carrying out the crosslinking reaction between the first crosslinkable ligands of the quantum dots and the second crosslinkable ligands, carrying out a crosslinking reaction between first crosslinkable ligands corresponding to adjacent quantum dots at the first temperature.

8. The manufacturing method according to claim 7, wherein each first crosslinkable ligand comprises: coordination groups which are subjected to coordination binding with the corresponding quantum dot body, first connecting groups connected with the coordination groups, and first crosslinkable groups connected with the first connecting groups; and each second crosslinkable ligand comprises: second connecting groups connected to the surface of the carrier film layer, and second crosslinkable groups connected to the second connecting groups.

9. The manufacturing method according to claim 8, wherein both the first crosslinkable groups and the second crosslinkable groups are cyclopentadiene or a derivative thereof; or, both the first crosslinkable groups and the second crosslinkable groups are dicyclopentadiene or a derivative thereof; or, both the first crosslinkable groups and the second crosslinkable groups are bisphenol p-aminolactone; or, one of the first crosslinkable group and the second crosslinkable group is maleimide, and the other is furan; or, one of the first crosslinkable group and the second crosslinkable group is maleic anhydride or a derivative thereof, and the other is polyol; or, one of the first crosslinkable group and the second crosslinkable group is maleimide, and the other is furfuryl ester.

10. The manufacturing method according to claim 1, wherein the removing the quantum dots in the region to be removed, comprises:

washing the quantum dots after being irradiated with the laser with a solvent, wherein the quantum dots in the region to be removed are dissolved in the solvent, and the quantum dots subjected to a crosslinking reaction are not dissolved in the solvent.

11. The manufacturing method according to claim 1, wherein the coating the substrate with the quantum dot solution, in response to the quantum dots being in the solution state, the first crosslinkable ligands being in the decrosslinking state, comprises:

heating the substrate to the second temperature, and coating the substrate with the quantum dot solution.

12. A quantum dot light-emitting device, comprising a substrate and a patterned quantum dot layer located on the substrate, wherein each quantum dot of the quantum dot layer comprises a quantum dot body and a first crosslinkable ligand connected to the surface of the quantum dot body; and the quantum dot layer is of a structure obtained after the first crosslinkable ligands are subjected to a crosslinking reaction at a first temperature wherein the substrate comprises: a base substrate, a first electrode located on the base substrate, and a carrier film layer located on the first electrode; wherein the quantum dot layer is located on the carrier film layer, and second crosslinkable ligands are connected to a surface of the carrier film layer; and the quantum dot layer is of a structure obtained after the first crosslinkable ligands and the second crosslinkable ligands are subjected to a crosslinking reaction; or, the quantum dot layer is of a structure obtained after a crosslinking reaction occurs between the first crosslinkable ligands and the second crosslinkable ligands, and a crosslinking reaction occurs between first crosslinkable ligands corresponding to adjacent quantum dots.

13. The quantum dot light-emitting device according to claim 12, wherein each first crosslinkable ligand comprises: coordination groups which are subjected to coordination binding with the corresponding quantum dot body, first connecting groups connected with the coordination groups, and first crosslinkable groups connected with the first connecting groups; and the quantum dot layer is of a structure obtained after a crosslinking reaction occurs between first crosslinkable groups corresponding to adjacent quantum dots.

14. The quantum dot light-emitting device according to claim 13, wherein each first crosslinkable group comprises at least one of: cyclopentadiene, a cyclopentadiene derivative, dicyclopentadiene, a dicyclopentadiene derivative or bisphenol p-aminolactone; or, the first crosslinkable group corresponding to at least one of the quantum dots comprises a first group and a second group; wherein, the first group is maleimide and the second group is furan; or, the first group is maleic anhydride or a derivative thereof, and the second group is polyol; or, the first group is maleimide and the second group is furfuryl ester;

wherein a mole number of the first group corresponding to at least one of the quantum dots is identical to a mole number of the second group corresponding to at least one of the quantum dots.

15. The quantum dot light-emitting device according to claim 13, wherein each coordination group comprises at least one of $-NH_2$, $-SH$, $-COOH$, $-P$ or $-PO_2$, and each first connecting group is $-(CH_2)_n-$, wherein n=2~6.

16. The quantum dot light-emitting device according to claim 12, wherein each first crosslinkable ligand comprises: coordination groups which are subjected to coordination binding with the corresponding quantum dot body, first connecting groups connected with the coordination groups, and first crosslinkable groups connected with the first connecting groups; and each second crosslinkable ligand comprises: second connecting groups connected to the surface of the carrier film layer, and second crosslinkable groups connected to the second connecting groups.

17. The quantum dot light-emitting device according to claim 16, wherein both the first crosslinkable groups and the second crosslinkable groups are cyclopentadiene or a derivative thereof; or, both the first crosslinkable groups and the second crosslinkable groups are dicyclopentadiene or a derivative thereof; or, both the first crosslinkable groups and the second crosslinkable groups are bisphenol p-aminolactone; or, one of the first crosslinkable group and the second crosslinkable group is maleimide, and the other is furan; or, one of the first crosslinkable group and the second crosslinkable group is maleic anhydride or a derivative thereof, and the other is polyol; or, one of the first crosslinkable group and the second crosslinkable group is maleimide, and the other is furfuryl ester.

18. The quantum dot light-emitting device according to claim 16, wherein the carrier film layer is an electron transport layer, and a structure of each second connecting group is

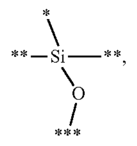

wherein * is a position connecting with the corresponding second crosslinkable group,  is a position connecting with other groups, and * is a position connecting with the electron transport layer.

19. The manufacturing method according to claim 8, wherein the carrier film layer is an electron transport layer, and a structure of each second connecting group is

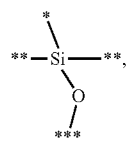

wherein * is a position connecting with the corresponding second crosslinkable group,  is a position connecting with other groups, and * is a position connecting with the electron transport layer.

* * * * *